US012646678B2

(12) United States Patent
O'Shaughnessy et al.

(10) Patent No.: US 12,646,678 B2
(45) Date of Patent: Jun. 2, 2026

(54) PLASMA-ENHANCED CHEMICAL VAPOR DEPOSITION REACTORS AND ASSOCIATED METHODS

(71) Applicant: Kayaku Advanced Materials, Inc., Westborough, MA (US)

(72) Inventors: W. Shannan O'Shaughnessy, Lincoln, MA (US); Sergio Fernandez, Somerville, MA (US); Andrew Grant, Lexington, MA (US); Lucas Black, Boston, MA (US)

(73) Assignee: Kayaku Advanced Materials, Inc., Westborough, MA (US)

( * ) Notice: Subject to any disclaimer, the term of this patent is extended or adjusted under 35 U.S.C. 154(b) by 0 days.

(21) Appl. No.: 18/439,532

(22) Filed: Feb. 12, 2024

(65) Prior Publication Data

US 2024/0282546 A1 Aug. 22, 2024

Related U.S. Application Data

(60) Provisional application No. 63/444,677, filed on Feb. 10, 2023.

(51) Int. Cl.

*H01J 37/32* (2006.01)
*C23C 16/40* (2006.01)

(Continued)

(52) U.S. Cl.

CPC .......... *H01J 37/063* (2013.01); *C23C 16/401* (2013.01); *C23C 16/505* (2013.01); *H01J 37/32449* (2013.01)

(58) Field of Classification Search

CPC ............... H01J 37/063; H01J 37/32449; H01J 37/32082; H01J 15/00; H01J 37/32091; H01J 37/3244; H01J 37/32623; H01J 37/32009; H01J 37/32532; C23C 16/401; C23C 16/505; C23C 16/455; C23C 16/45512; C23C 16/4587; C23C 16/50; C23C 16/52; C23C 16/507; C23C 16/509; C23C 16/5096; C23C 16/45565;

(Continued)

(56) References Cited

U.S. PATENT DOCUMENTS 5,304,255 A 4/1994 Li
5,580,384 A 12/1996 Thiebaud (Continued)

FOREIGN PATENT DOCUMENTS

WO 2022057977 A1 3/2022

OTHER PUBLICATIONS

Coclite et al., "Initiated PECVD of Organosilicon Coatings: A New Strategy to Enhance Monomer Structure Retention", Plasma Processes and Polymers, vol. 9, No. 4, (2012).

(Continued)

*Primary Examiner* — Rudy Zervigon
(74) *Attorney, Agent, or Firm* — Pabst Patent Group LLP

(57) ABSTRACT

Plasma-enhanced chemical vapor deposition (PECVD) reactors and methods of fabricating polymers via PECVD processes are generally provided. In some embodiments, a PECVD reactor has one or more features that enhance the quality of the polymers that may be formed therein. Similarly, some methods are performed in a manner that enhances the quality of a polymer formed thereby.

10 Claims, 10 Drawing Sheets

(51) Int. Cl.
*C23C 16/505* (2006.01)
*H01J 37/063* (2006.01)

(58) Field of Classification Search
CPC ..... C08G 77/20; C08G 77/04; A61L 2420/02; A61L 27/34; H01L 21/02126; H01L 21/02216; H01L 21/67069
USPC ..... 118/723 E, 723 ER; 156/345.43, 345.44, 156/345.45, 345.46, 345.47
See application file for complete search history.

(56) References Cited

U.S. PATENT DOCUMENTS

| | | | | | |
|---|---|---|---|---|---|
| 5,688,330 | A * | 11/1997 | Ohmi | H01J 37/32165 | 118/723 E |
| 6,284,668 | B1 * | 9/2001 | Imahashi | H01J 37/32357 | 257/E21.252 |
| 10,294,560 | B2 * | 5/2019 | Rudolph | F16K 1/226 | |
| 10,982,325 | B2 * | 4/2021 | Kostamo | C23C 16/45544 | |
| 11,393,679 | B2 | 7/2022 | O'Shaughnessy | | |
| 11,679,412 | B2 | 6/2023 | O'Shaughnessy | | |
| 2006/0151884 | A1 | 7/2006 | Hara | | |
| 2009/0136665 | A1 * | 5/2009 | Choi | H01L 21/68742 | 118/728 |
| 2010/0183825 | A1 * | 7/2010 | Becker | C23C 16/45555 | 427/569 |
| 2013/0040102 | A1 | 2/2013 | Gleason | | |
| 2017/0107345 | A1 | 4/2017 | Kon | | |
| 2018/0119278 | A1 | 5/2018 | Kornmeyer | | |
| 2022/0388032 | A1 | 12/2022 | O'Shaughnessy | | |

OTHER PUBLICATIONS

International Search Report PCT/US2024/015412 mailed Jun. 11, 2024.

O'Shaughnessy et al., "Initiated Chemical Vapor Deposition of Trivinyltrimethylcyclotrisiloxane for Biomaterial Coatings" Langmuir; vol. 22 No. 16 p. 7021-7026 (2006).

International Search Report PCT/US2017/037291 mailed Sep. 20, 2017.

* cited by examiner

1334

1336

Flow a precursor gas comprising an initiator and a monomer in proximity to a substrate

1338

Deposit a polymer formed from the monomer on the substrate

PLASMA-ENHANCED CHEMICAL VAPOR DEPOSITION REACTORS AND ASSOCIATED METHODS

CROSS-REFERENCE TO RELATED APPLICATION

This application claims priority to U.S. Application No. 63/444,677 filed on Feb. 10, 2023, the contents of which are hereby incorporated by reference in its entirety.

FIELD

The present invention relates generally to plasma-enhanced chemical vapor deposition reactors and to methods of fabricating polymers via plasma-enhanced chemical vapor deposition.

BACKGROUND

Chemical vapor deposition reactors may be employed to deposit polymeric coatings. However, some reactors may have designs that expose monomers to too much energy and/or have designs that cause monomers to flow in an undesirable manner.

Accordingly, improved chemical vapor deposition reactors and methods are needed.

SUMMARY

Plasma-enhanced chemical vapor deposition reactors, related components, and related methods are generally described.

In some embodiments, a method of fabricating a polymer via a plasma-enhanced chemical vapor deposition (PECVD) process is provided. The method comprises flowing a precursor gas in proximity to a substrate within a deposition chamber positioned in a PECVD reactor. The precursor gas comprises an initiator and at least one monomer comprising a cyclic siloxane and at least two vinyl groups. The total energy to which the monomer is exposed while flowing within the deposition chamber is greater than or equal to $1.5\times10^{-24}$ J/molecule and less than or equal to $32\times10^{-24}$ J/molecule. The method further comprises depositing a polymer formed from the at least one monomer on at least a portion of the substrate.

In some embodiments, a method of fabricating a polymer via a PECVD process comprises flowing a precursor gas in proximity to a substrate within a deposition chamber positioned in a PECVD reactor. The precursor gas comprises an initiator and at least one monomer. The deposition chamber is enclosed by a plurality of walls. A plasma electrode is positioned inside the deposition chamber. A ratio of a spacing between the plasma electrode and a sidewall to which it is closest to a spacing between the plasma electrode at its closest point and the bottom wall is greater than or equal to 0.06 and less than or equal to 0.15. The method further comprises depositing a polymer formed from the at least one monomer on at least a portion of the substrate.

In some embodiments, a PECVD reactor is provided. The reactor comprises a deposition chamber and a control system. The control system is configured to control one or more of a composition of a precursor gas, a flow rate of a precursor gas, a pressure inside the deposition chamber, and/or a power supplied by a plasma electrode. The control system is configured to maintain the total energy to which a monomer flowing through the deposition chamber is exposed at a value that is greater than or equal to $1.5\times10^{-24}$ J/molecule and less than or equal to $32\times10^{-24}$ J/molecule.

In some embodiments, a PECVD reactor comprises a deposition chamber enclosed by a plurality of walls and a plasma electrode positioned inside the deposition chamber. The spacing between the plasma electrode and the sidewall to which it is closest may be selected to be as small as possible while permitting laminar flow of the precursor gas through the gap between the plasma electrode and the sidewall. The ratio of spacing between a plasma electrode and a sidewall to which it is closest to a spacing between the plasma electrode and the bottom wall is selected to be within a suitable range to allow for laminar flow of the precursor gas. Optionally the ratio of a spacing between the plasma electrode and a sidewall to which it is closest to a spacing between the plasma electrode and the bottom wall is greater than or equal to 0.1 and less than or equal to 0.4, such as greater than or equal to 0.1 and less than or equal to 0.35, greater than or equal to 0.1 and less than or equal to 0.3, greater than or equal to 0.1 and less than or equal to 0.25, or greater than or equal to 0.1 and less than or equal to 0.2.

Other advantages of the present invention will become apparent from the following detailed description. In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment shown where illustration is not necessary to allow those of ordinary skill in the art to understand the invention. In the figures.

DETAILED DESCRIPTION

Plasma-enhanced chemical vapor deposition (PECVD) reactors and methods of fabricating polymers via PECVD processes are generally provided. In some embodiments, a PECVD reactor has one or more features that enhance the quality of the polymers that may be formed therein. Similarly, some methods are performed in a manner that enhances the quality of a polymer formed thereby.

As one example, in some embodiments, a PECVD reactor is configured such that monomers flowing therein are exposed to a total energy that is in a range sufficient to catalyze the polymer formation but low enough so that one or more desirable features of the monomer are retained. This may be accomplished by the inclusion of a control system that is configured to adjust one or more features of the PECVD reactor (e.g., precursor gas composition, precursor gas flow rate, pressure inside the deposition chamber, power supplied by a plasma electrode) in order to maintain the total energy per monomer within a desirable range. Some methods may comprise flowing a precursor gas comprising a monomer in such a reactor, depositing a polymer on a substrate in such a reactor, and/or flowing a precursor gas such that the monomer is exposed to a total energy within a desirable range.

As another example, in some embodiments, a PECVD reactor comprises a plasma electrode that is positioned at a location in a deposition chamber that enhances the tendency of gases to flow out of the deposition chamber in a laminar manner. For instance, the plasma electrode may be positioned at a location with respect to the bottom wall and the sidewalls of the deposition chamber that allows for laminar flow around the plasma electrode and out an outlet positioned in the bottom wall. Some methods may comprise flowing a precursor gas in a reactor having such a design and/or depositing a polymer on a substrate in a reactor having such a design.

Figure 1:
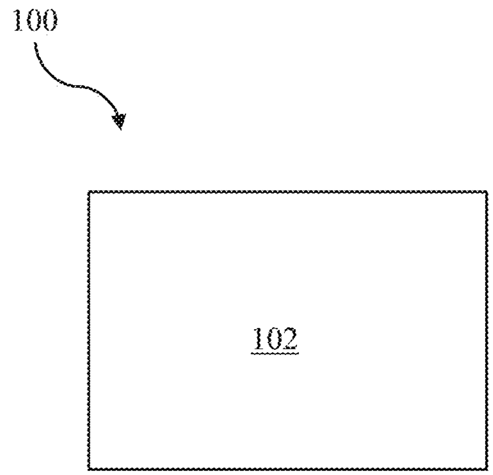
FIGS. 1-3 show non-limiting embodiments of a PECVD reactor, in accordance with some embodiments.

FIG. 1 shows one non-limiting embodiment of a PECVD reactor having one or more advantageous features. In FIG. 1, the PECVD reactor 100 comprises a deposition chamber 102. The deposition chamber may be a chamber in which a polymer is deposited on a substrate by a PECVD process. This may be accomplished by flowing a precursor gas in proximity to the substrate in the deposition chamber. During the precursor gas flow, the precursor gas may be exposed to energy that catalyzes the reaction of one or more species therein (e.g., one or more monomers, one or more initiators) to form a polymer that deposits on the substrate.

Figure 2:
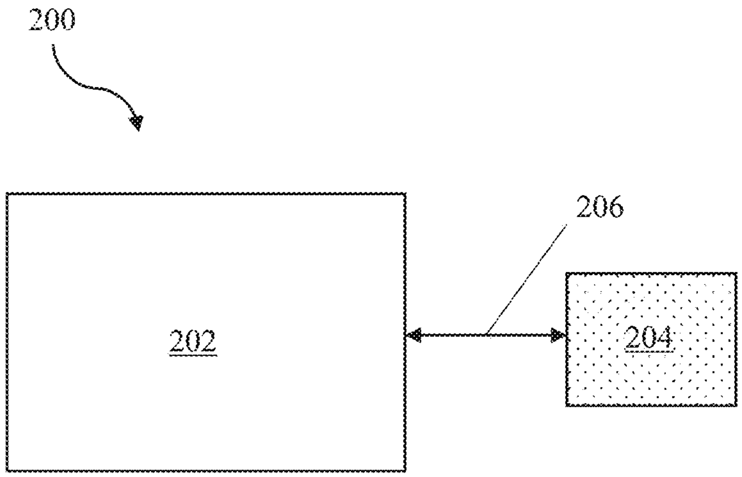

FIG. 2 shows a second non-limiting embodiment of a PECVD reactor. The PECVD reactor 200 shown in FIG. 2 comprises a control system 204 in addition to a deposition chamber 202. The control system is operatively coupled to the deposition chamber, as shown by the link 206. The operative coupling may be electronic, mechanical, and/or by wireless signal. In some embodiments, the operative coupling takes the form of operative coupling to a component of the deposition chamber (e.g., an inlet positioned therein, an outlet positioned therein, a plasma electrode positioned therein, a heating and/or cooling system positioned therein). It is also possible for the operative coupling to take the form of an operative coupling to a component of the PECVD reactor other than the deposition chamber but that itself affects one or more features of the deposition chamber (e.g., to a source of gas upstream from the deposition chamber, to a location to which gas may be exhausted from the deposition chamber, to a heating and/or cooling system positioned around the deposition chamber, to a heating and/or cooling system positioned in and/or around a source of gas upstream from the deposition chamber, to a switch positioned between the deposition chamber and a source of a gas upstream from the deposition chamber, to a mass flow controller positioned between the deposition chamber and a source of a gas upstream from the deposition chamber, to a pressure sensor in fluidic communication with the deposition chamber, to a valve positioned downstream from an outlet of the deposition chamber).

Control systems may be suitable for controlling a variety of properties of the PECVD reactors described herein. For instance, the control system may be configured to control one or more features of the deposition chamber, such as the temperature, total pressure, pressure of one or more species therein (e.g., one or more monomers, and/or one or more initiators), flow rate of a precursor gas therethrough, flow rate of one or more species therethrough (e.g., one or more monomers, and/or one or more initiators), overall gas residence time, residence time of one or more species therein (e.g., one or more monomers, and/or one or more initiators), composition of a precursor gas, power supplied by a plasma electrode, plasma intensity, and/or plasma duty cycle. In some embodiments, a PECVD reactor may be configured such that the control system controls one or more such features in a manner that maintains the total energy to which monomers flowing in the PECVD reactor are exposed in a particular range, such as in a range of greater than or equal to $1.5\times10^{-24}$ J/molecule and less than or equal to $32\times10^{-24}$ J/molecule.

Figure 3:
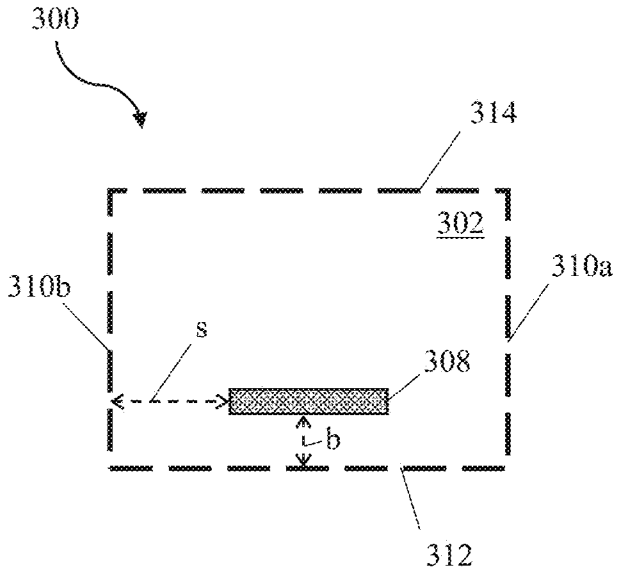

FIG. 3 shows a third non-limiting embodiment of a PECVD reactor. In FIG. 3, the PECVD reactor 300 includes a plasma electrode 308 positioned in the deposition chamber 302. As also shown in FIG. 3, the deposition chamber may be enclosed by a plurality of walls including sidewalls 310*a*, 310*b* and a bottom wall 312. It is also possible for the walls enclosing the deposition chamber to include a top wall 314. In some embodiments, a plasma electrode positioned in a PECVD reactor is electrically isolated from one or more (or all) of the walls of the deposition chamber. The plasma electrode may be spaced from the sidewalls and bottom wall of the reactor in a manner that is particularly advantageous. For instance, the ratio of the spacing of the plasma electrode from the sidewall to which it is closest and the bottom wall may be in a range that promotes laminar flow. The spacing of the plasma electrode from each sidewall may be determined by determining the distance between the closest point on the plasma electrode to that sidewall and the sidewall. In FIG. 3, this is shown schematically for the left sidewall by the distance “s.” The spacing of the plasma electrode from the bottom wall may be determined by determining the distance between the closest point on the plasma electrode to the bottom wall and the bottom wall. In FIG. 3, this is shown schematically by the distance “b.”

Optionally the ratio of the spacing between the plasma electrode and a sidewall to which it is closest (s) to the spacing between the closest point on the plasma electrode to the bottom wall (b) is greater than or equal to 0.1 and less than or equal to 0.4. For example, the spacing ratio s:b can be in the range of greater than or equal to 0.1 and less than or equal to 0.35, greater than or equal to 0.1 and less than or equal to 0.3, greater than or equal to 0.1 and less than or equal to 0.25, greater than or equal to 0.1 and less than or equal to 0.2, greater than or equal to 0.12 and less than or equal to 0.4, greater than or equal to 0.12 and less than or equal to 0.35, greater than or equal to 0.12 and less than or equal to 0.3, greater than or equal to 0.12 and less than or equal to 0.25, greater than or equal to 0.12 and less than or equal to 0.2, greater than or equal to 0.15 and less than or equal to 0.4, greater than or equal to 0.15 and less than or equal to 0.35, greater than or equal to 0.15 and less than or equal to 0.3, greater than or equal to 0.15 and less than or equal to 0.25, or greater than or equal to 0.15 and less than or equal to 0.2.

For example, the spacing ratio s:b can be greater than or equal to 0.1, greater than or equal to 0.11, greater than or equal to 0.12, greater than or equal to 0.13, greater than or equal to 0.14, greater than or equal to 0.15, greater than or equal to 0.16, greater than or equal to 0.17, greater than or equal to 0.18, greater than or equal to 0.19, greater than or equal to 0.2. In some embodiments, the spacing ratio s:b is less than or equal to 0.5, less than or equal to 0.45, less than or equal to 0.4, less than or equal to 0.35, less than or equal to 0.3, less than or equal to 0.25, less than or equal to 0.2, or less than or equal to 0.15. Combinations of the above-referenced ranges are also possible (e.g., greater than or equal to 0.11 and less than or equal to 0.3, greater than or equal to 0.16 and less than or equal to 0.25, or greater than or equal to 0.16 and less than or equal to 0.2). Other ranges of the spacing ratio s:b are also possible as long as they allow for laminar flow of the precursor gas.

Figure 4:
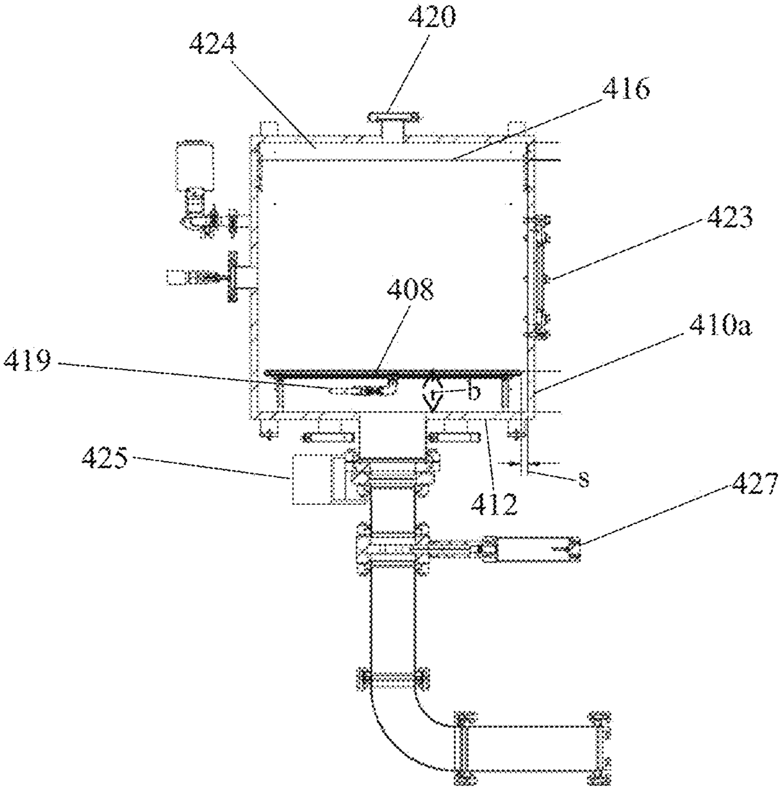
FIG. 4 shows a cross-sectional view of one exemplary deposition chamber, in accordance with some embodiments.
Figure 14:
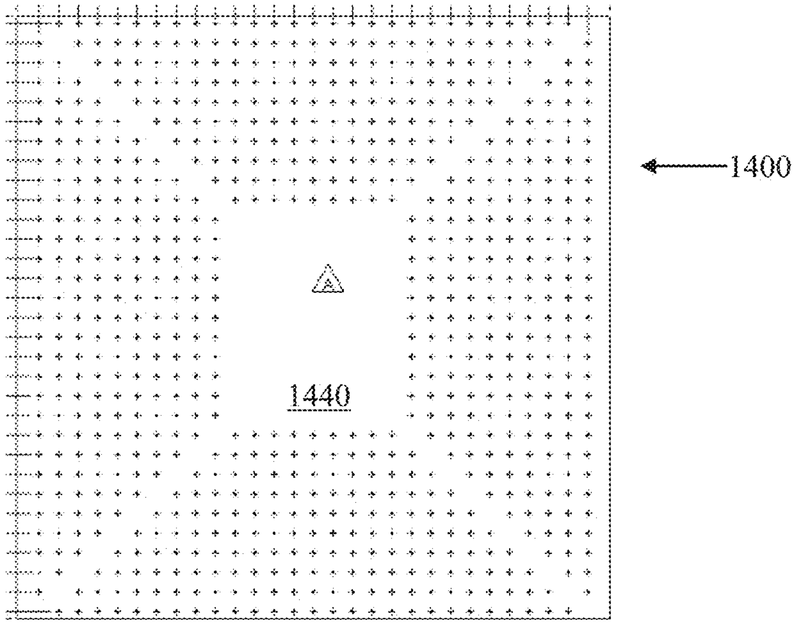
FIG. 14 shows one non-limiting embodiment of a showerhead, in accordance with some embodiments.

FIG. 4 shows a cross-sectional view of one exemplary deposition chamber in which the ratio of the spacing of the plasma electrode 408 from the sidewall to which it is closest (s) and the bottom wall (b) is in a range that promotes laminar flow. As can be seen in FIG. 4, the plasma electrode may be supplied with power via a power cable 419. FIG. 4 also shows various further components of an exemplary PECVD reactor system, which are described in further detail elsewhere herein. These include a ground electrode 416, a premixing zone 424, a gas port 420 through which a precursor gas may be introduced into the premixing zone 424, a view port 423, an isolation valve 425, and vacuum valve 427. Optionally, the ground electrode also serves as an inlet to the deposition chamber. Optionally the inlet is in the form of a showerhead, such as described below, optionally the showerhead has a configuration as depicted in FIG. 14.

In some embodiments, a deposition chamber is fully enclosed on all sides by a plurality of walls. In other words, in some embodiments, a deposition chamber lacks open sides through which gas can freely enter or exit and lacks spaces or junctions between walls through which gas can freely enter or exit. In some embodiments, the walls enclosing a deposition chamber cause the deposition chamber to be gas-tight. It is also possible for the walls to meet at gas-tight junctions and/or to enclose the deposition chamber such that the only manner in which gas can enter the deposition chamber is through one or more inlets and/or such that the only manner in which gas can exit the deposition chamber is through one or more outlets. In some embodiments, the walls enclose the deposition chamber in a manner that allows for the pressure inside the deposition chamber to be maintained at a value that is different from the pressure in an environment enclosing the deposition chamber and/or at a value that is substantially uniform.

In some embodiments, a PECVD reactor comprises a ground electrode. The plasma electrode and the ground electrode may be employed together to generate a plasma inside the deposition chamber. For instance, the plasma electrode may be held at a potential (and/or an alternating potential) that is sufficient to generate a plasma inside the deposition chamber. The plasma may be provided at an energy and/or across a spatial extent such that monomer flowing in the deposition chamber are exposed to a total energy that can be controlled. The level of control may be at a precision suitable for maintaining the total energy to which the monomer is exposed within a defined range.

Figure 5:
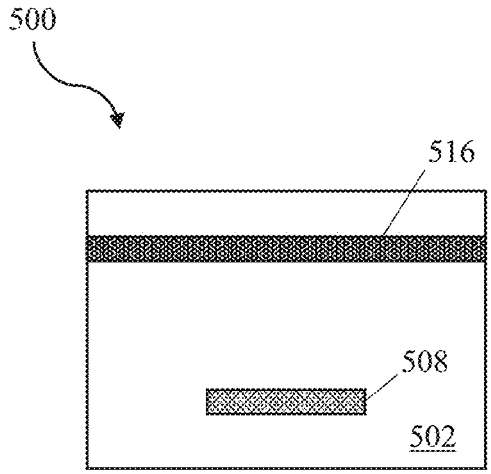
FIGS. 5-9 show further non-limiting embodiments of a PECVD reactor, in accordance with some embodiments.

FIG. 5 shows one non-limiting embodiment of a PECVD reactor in which both a plasma electrode and a ground electrode are positioned inside a deposition chamber. In FIG. 5, the PECVD reactor 500 comprises a deposition chamber 502 in which a plasma electrode 508 and a ground electrode 516 are positioned. In some embodiments, like the embodiment shown in FIG. 5, a ground electrode extends across the entire cross-section of the deposition chamber in which it is positioned in one or two directions. Such an embodiment is also shown in FIG. 4. In this embodiment, the ground electrode can also serve as or include one or more apertures configured to serve as an inlet. It is also possible for a ground electrode to form one of the walls of the deposition chamber (e.g., a top wall of the deposition chamber, or a wall of the deposition chamber comprising an inlet). In such embodiments, the ground electrode may or may not form a gas-tight seal with one or more of other walls enclosing the deposition chamber. It is also possible for a ground electrode to be positioned internal to a deposition chamber and/or to occupy less than the full cross-section of a deposition chamber in one or more directions.

Figure 6:
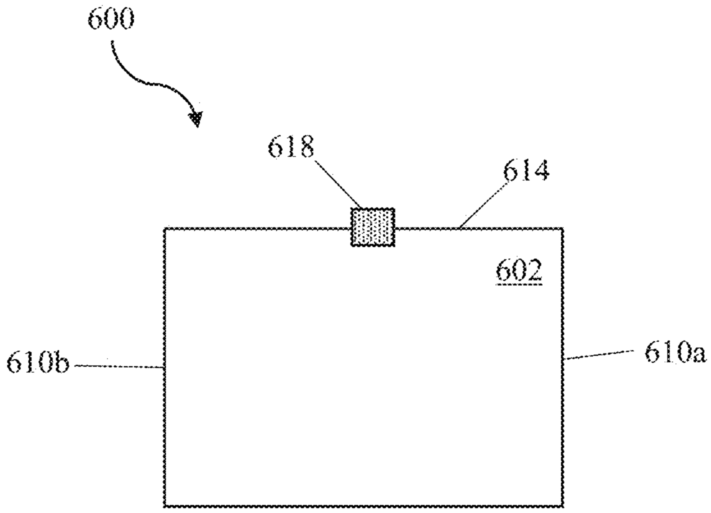

In some embodiments, a PECVD reactor comprises an inlet through which a precursor gas may be introduced into a deposition chamber. FIG. 6 shows such a PECVD reactor schematically. In FIG. 6, the PECVD reactor 600 comprises a deposition chamber 602 that comprises an inlet 618. As shown in FIG. 6, the inlet may be positioned in a top wall 614 of the deposition chamber. However, it is also possible for the inlet to be positioned in another location, such as in a sidewall 610*a* or 610*b* of the deposition chamber.

In some embodiments, an inlet takes the form of an aperture and/or a plurality of apertures in the wall in which it is positioned. The aperture(s) may be in fluidic communication with a source of a precursor gas. It is also possible for the inlet to take the form of a structural element that extends into the deposition chamber from the wall in which it is positioned. In such embodiments, the inlet may comprise a component (e.g., a hollow core) that is in fluidic communication with a source of a precursor gas and one or more apertures that pass from that component to an external surface of the inlet. Such apertures may be positioned at a variety of locations in the inlet (e.g., in a portion of the inlet that is distal to the wall from which the inlet extends and/or in a portion of the inlet that is proximal to the wall from which the inlet extends). In some embodiments, a PECVD reactor comprises an inlet that takes the form of a showerhead. In other words, the inlet may comprise a plurality of apertures that are arranged on a flat surface. The flat surface may be a flat surface of a top wall of the deposition chamber or may be a sidewall of the deposition chamber. It is also possible for the flat surface to be a flat surface of a structural element extending into the deposition chamber from a sidewall or a top wall. Without wishing to be bound by any particular theory, it is believed that an inlet that takes the form of a showerhead may be well-suited to distributing a precursor gas uniformly across a substrate positioned in the deposition chamber.

In some embodiments, a PECVD reactor comprises an inlet that is also a ground electrode. As one example, a PECVD reactor may comprise an inlet that is both a showerhead and a ground electrode. Optionally, the PECVD reactor depicted in FIG. 4 contains a ground electrode 416 that is also an inlet, optionally the inlet is in the form of a showerhead. Such an inlet may, in some embodiments, also take the form of a top wall of the deposition chamber.

Figure 7:
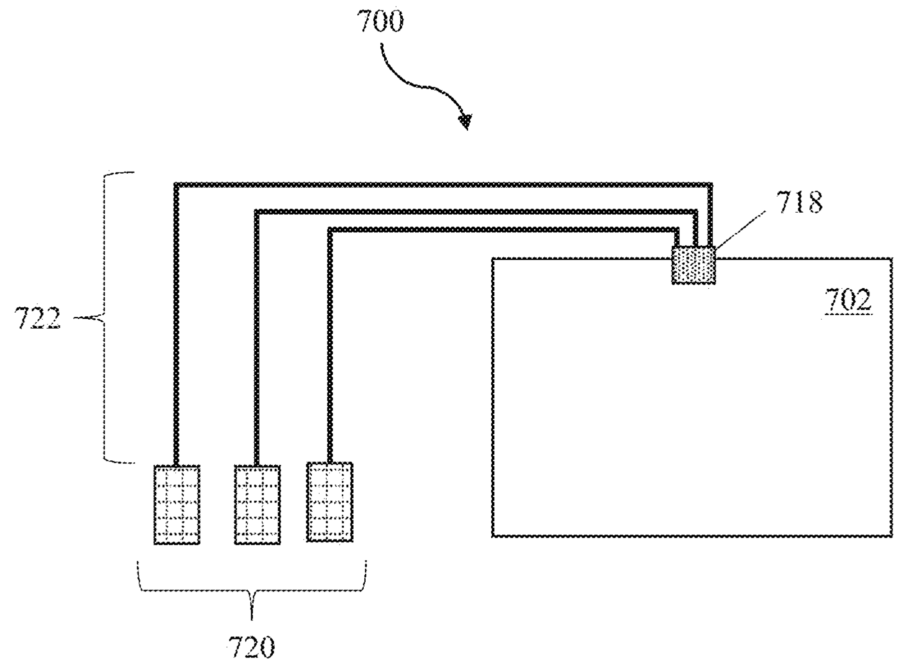

A PECVD reactor may comprise one or more features upstream from an inlet. For instance, a PECVD reactor may comprise one or more sources of gas. The sources of gas may comprise sources of a monomer, sources of an initiator, and/or sources of a carrier gas. It is also possible for a source of gas to comprise two or more of the above (e.g., a source of gas may be a source of a monomer provided in a carrier gas or an initiator provided in a carrier gas). The sources of gas may be in fluidic communication with the inlet via a conduit, such as via tubing. It is also possible for the sources of gas to be directly interfaced with the inlet (e.g., via an aperture). FIG. 7 shows one non-limiting example of a PECVD reactor 700 comprising three sources of gas 720. Each source of gas is in fluidic communication with the inlet 718 via conduits 722. It is also possible for two or more (or all) sources of gases to be in fluidic communication with an inlet via a manifold that supplies the inlet with the gases through a single conduit.

Gases may be supplied at room temperature or at a temperature other than room temperature (e.g., a temperature above room temperature) For example, gases may be supplied at a temperature in the range of 10-150° C., 20-100° C., 20-75° C., 20-50° C., 20-40° C., or 20-35° C. In some embodiments, a source of gas comprises a liquid that is contained in a container. The liquid may be heated and/or vaporized to form a gas that can be supplied to a deposition chamber. In such embodiments, it is possible for a PECVD reactor to comprise a heating and/or cooling system positioned in and/or around the source of gas (e.g., in and/or around a container containing a gas and/or a liquid).

In some embodiments, a PECVD reactor comprises an inlet and one or more sources of gas and further comprises one or more components positioned between the inlet and the one or more sources of gas (e.g., upstream from the inlet and downstream from the one or more sources of gas). As one example, a PECVD reactor may comprise one or more switches positioned between the inlet and the one or more sources of gas. The switch(es) may be capable of placing one or more of the sources of gas in fluidic communication with the inlet and/or removing one or more sources of gas from fluidic communication with the inlet. As another example, a PECVD reactor may comprise one or more mass flow controllers positioned between the inlet and one or more sources of gas. The mass flow controller(s) may be capable of controlling the flow rate of the gas at the inlet. As a third example, a PECVD reactor may comprise a port through which a gas may be introduced to a component upstream from the inlet and/or to the inlet.

Figure 8:
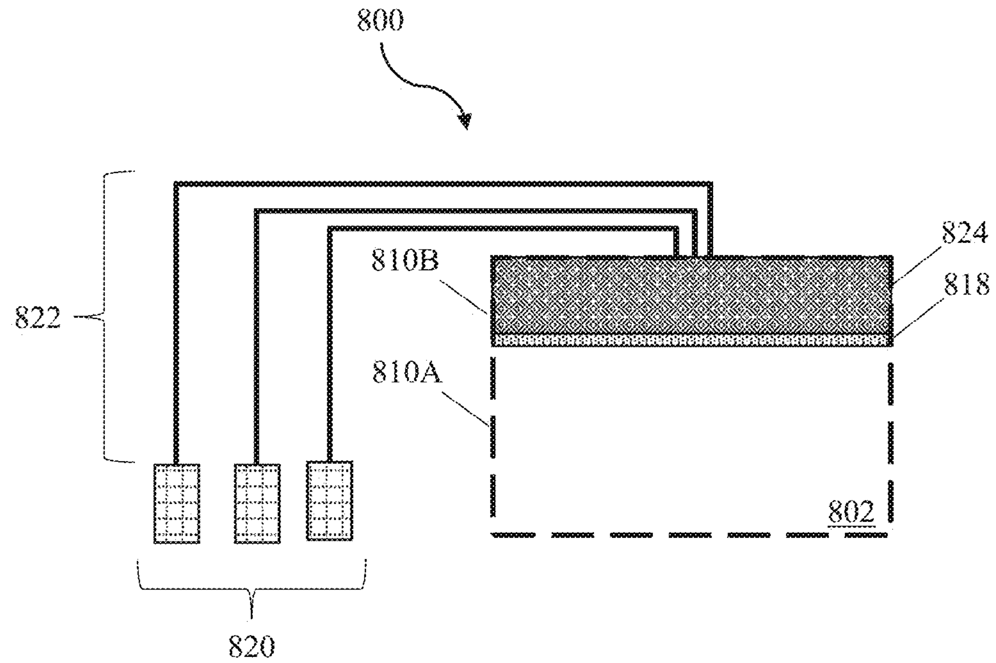

As a fourth example, in some embodiments, a PECVD reactor comprises a premixing zone positioned between the inlet and the one or more sources of gas. The premixing zone may take the form of a chamber in which gases supplied by two or more different sources of gas (and/or a manifold) can mix before flowing into the inlet. The mixed gases may flow into the premixing zone via a port and then make up a precursor gas that flows into the inlet (e.g., after mixing in the premixing zone). FIG. 4 shows one non-limiting example of a PECVD reactor comprising a premixing zone. FIG. 8 shows another non-limiting example of a PECVD reactor comprising a premixing zone. In FIG. 8, the premixing zone 824 is in downstream from and in fluidic communication with the three sources of gas 820 and upstream from and in fluidic communication with the inlet 818. The premixing zone may be in fluidic communication with sources of gas and/or an inlet via conduits, such as tubing. It is also possible for the premixing zone to be directly fed by the sources of gas (e.g., via apertures) and/or to directly supply gas to the inlet (e.g., via an aperture and/or a plurality of apertures). It is also possible for one or more further components, such as one or more switches and/or mass flow controllers, to be positioned between a source of gas and a premixing zone and/or between a premixing zone and an inlet. In some embodiments, two or more (or all) sources of gases to be in fluidic communication with an inlet via a manifold that supplies the inlet with the gases through a single conduit.

As shown in FIG. 8, in some embodiments, a premixing zone takes the form of a volume that is separated from a deposition chamber by an inlet. In such embodiments, the inlet may be directly adjacent to both the premixing zone and the deposition chamber. It is also possible for the deposition chamber and the premixing zone both to be enclosed by pluralities of walls, and for some of these walls to be common to both pluralities of walls. For instance, an inlet may form (all or a part of) a wall that is part of the plurality of walls that encloses the premixing zone and part of the plurality of walls that enclose the deposition chamber. It is also possible for one or more walls to extend such that they comprise one portion that is part of a plurality of walls enclosing a deposition chamber and one portion that is part of a plurality of walls enclosing a premixing zone. With reference to FIG. 8, the sidewall 810 comprises a portion 810A that is part of a plurality of walls enclosing the deposition chamber 802 and a portion 810B that is part of a plurality of walls enclosing the premixing zone 824.

In some embodiments, the volume of a premixing zone may be adjusted by moving one or more of the walls by which it is enclosed. In some embodiments, the wall that may be moved may be a wall that is also an inlet and/or a ground electrode. In some embodiments, the wall that may be moved may be a wall that separates the premixing zone from the deposition chamber, such as a wall that is part of both a plurality of walls enclosing the premixing zone and a plurality of walls enclosing the deposition chamber. For instance, with reference to FIG. 8, the inlet 818 may be a wall that encloses the premixing zone and that may be movable. The movable wall may be movable towards and away from the bottom of the deposition chamber. Moving the movable wall towards the bottom of the deposition chamber may reduce the volume of the deposition chamber and increase the volume of the premixing zone. Moving the movable wall away from the bottom of the deposition chamber may increase the volume of the deposition chamber and reduce the volume of the premixing zone.

Figure 9:
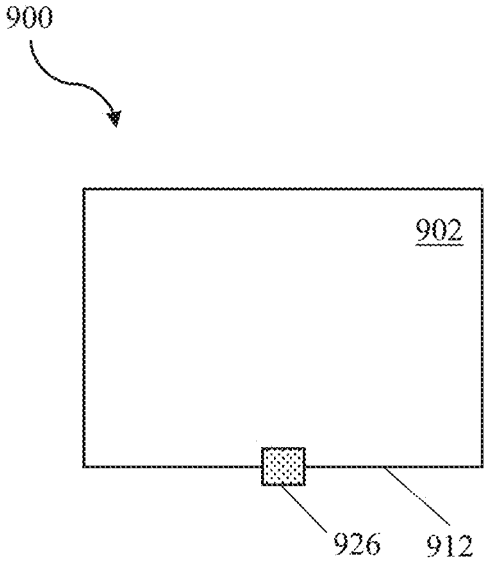

In some embodiments, a PECVD reactor comprises an outlet through which gas may be removed from a deposition chamber. FIG. 9 shows such a PECVD reactor schematically. In FIG. 9, the PECVD reactor 900 comprises a deposition chamber 902 that comprises an outlet 926. As shown in FIG. 9, the outlet may be positioned in a bottom wall 912 of the deposition chamber 902. However, it is also possible for the outlet to be positioned in another location, such as in a sidewall of the deposition chamber. In some embodiments, a PECVD reactor comprises an outlet that takes the form of an exhaust port.

In some embodiments, an outlet takes the form of an aperture and/or a plurality of apertures in the wall in which it is positioned. The aperture(s) may be in fluidic communication with a location to which gas may be exhausted. It is also possible for the outlet to take the form of a structural element that extends into the deposition chamber from the wall in which it is positioned. In such embodiments, the outlet may comprise a component (e.g., a hollow core) that is in fluidic communication with a location to which gas and one or more apertures that pass from that component to an external surface of the outlet. Such apertures may be positioned at a variety of locations in the outlet (e.g., in a portion of the outlet that is distal to the wall from which the outlet extends and/or in a portion of the outlet that is proximal to the wall from which the outlet extends).

A PECVD reactor may comprise one or more components positioned downstream from an outlet. Such components may assist with exhausting gas leaving the deposition chamber and/or with maintaining a particular pressure and/or atmosphere within the deposition chamber. As one example, a PECVD reactor may comprise an isolation valve (see, e.g. 425 in FIG. 4) positioned downstream from the outlet, which may (when closed) fluidically isolate the deposition chamber from the atmosphere downstream thereto. As another example, a PECVD reactor may comprise a vacuum valve positioned downstream from the deposition chamber. The vacuum valve (see, e.g. 427 in FIG. 4) may be fluidically connected to a source of vacuum. In some embodiments, a vacuum valve is capable of maintaining and/or configured to maintain a particular pressure inside the deposition chamber (e.g., a pressure less than atmospheric pressure). In some such embodiments, the vacuum valve is operatively coupled to a baritron and/or a PID loop. The operative coupling may be electronic, mechanical, and/or by wireless signal.

In some embodiments, a PECVD reactor comprises a view port positioned in a deposition chamber. An example of a PECVD reactor that comprises a view port 423 is depicted in FIG. 4. The view port may allow an operator to visually assess or otherwise monitor the operation of the PECVD reactor during a deposition process. In some embodiments, a view port may be positioned such that a laser interferometer positioned external to the view port may be capable of measuring and/or configured to measure the thickness of a polymer forming on a substrate during performance of a deposition process.

Figure 10:
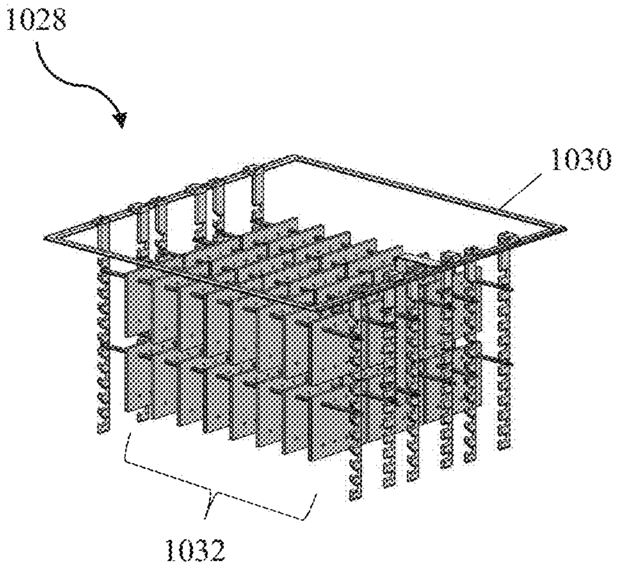
FIG. 10 shows an example of a racking system, in accordance with some embodiments.

In some embodiments, a PECVD reactor comprises a racking system. FIG. 10 shows one example of a racking system. In some embodiments, a racking system comprises a support structure for suspending a plurality of substrates in a deposition chamber. This is shown schematically in FIG. 10, in which the racking system 1028 comprises a support structure 1030 from which a plurality of substrates 1032 are suspended. As shown in FIG. 10, a racking system may comprise a plurality of vertical struts and/or horizontal struts. In some embodiments, like the embodiment shown in FIG. 10, a racking system may have a design that allows for substrates to hang from horizontal struts. Such substrates may comprise one or more holes that allow them to hang in this manner or may be attached to a further component of the racking system (e.g., a substrate support, a hook) that includes such holes. The attachment may be facilitated in a variety of suitable manners, such as mechanically (e.g., via clips and/or a hook) and/or with the assistance of an adhesive.

In some embodiments, a racking system is adjustable in one or more ways. For instance, the positions at which the racking system suspends substrates, the number of substrates suspended, and/or the spacing between substrates may be adjustable. As one example, in some embodiments, the vertical positions of the horizontal struts may be adjustable. For instance, as shown in FIG. 10, the horizontal struts may be supported by one or more brackets. In some embodiments, the horizontal struts may be capable of being repositioned by being removed from one set of brackets and positioned in another set of brackets (e.g., at a different height). In some embodiments, a support structure may have a design that allows for a plurality of substrates to be suspended from a horizontal strut that can then be positioned in a set of brackets. In such embodiments, the support structure may allow for removal of the horizontal strut from the brackets and removal of the substrates from the horizontal strut subsequent to polymer deposition.

Figure 11:
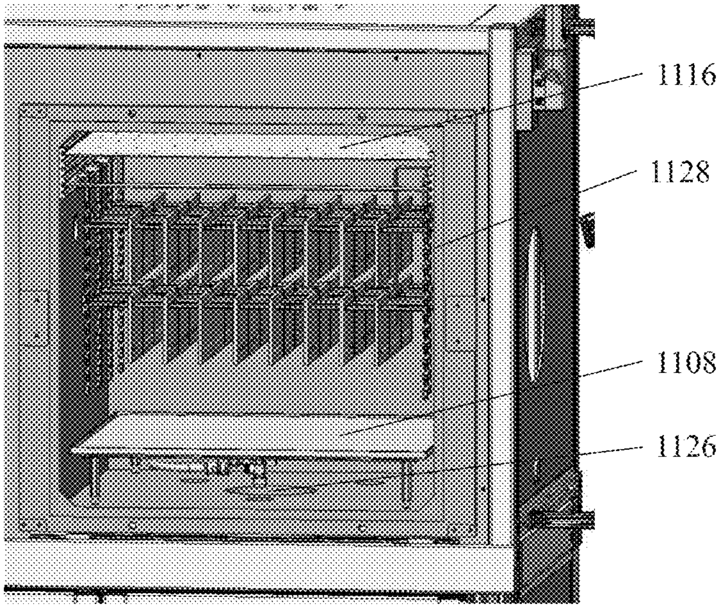
FIG. 11 shows one example of a racking system 1128 positioned inside a deposition chamber, in accordance with some embodiments.

In some embodiments, a racking system may be positioned in a deposition chamber, capable of being positioned in a deposition chamber, and/or configured to be positioned in a deposition chamber. In such embodiments, the racking system may also be capable of being removed from the deposition chamber and/or configured to be removed from the deposition chamber. This may allow for substrates to be suspended by the racking system outside of the deposition chamber prior to the racking system being positioned in the deposition chamber. It may also allow for substrates to be removed from the racking system subsequent to racking system removal from the deposition chamber. FIG. 11 shows one example of a racking system 1128 positioned inside a deposition chamber.

FIG. 11 also shows a plasma electrode 1108, a ground electrode 1116, and an outlet 1126. A precursor gas may enter the deposition chamber shown in FIG. 11 via the ground electrode 1116 (also functioning as an inlet), flow through the deposition chamber downwards in proximity to the substrates suspended by the racking system 1128, and then flow outwards through the outlet 1126.

It is also possible for a PECVD reactor to comprise a component other than a racking system that is suitable for supporting, suspending, and/or positioning samples. As one example, a PECVD reactor may comprise a mesh on which samples can be supported and/or from which hooks can hang. In such embodiments, samples may be capable of being hung from hooks that themselves hang from the mesh.

Figure 12:
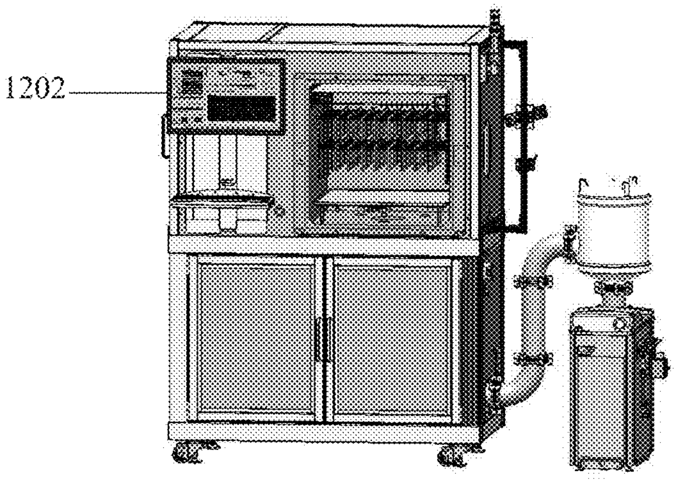
FIG. 12 shows a further non-limiting embodiment of a PECVD reactor, in accordance with some embodiments.

FIG. 12 shows one non-limiting embodiment of a PECVD reactor including the components described above. As can be seen from FIG. 12, a PECVD reactor may further comprise a display screen 1202 and/or one or more components that allows an operator to provide instructions and/or view data regarding the PECVD reactor and/or a deposition process occurring therein.

PECVD reactors may also comprise further features not shown in FIGS. 1-12, such as heating and cooling systems (e.g., those positioned around and/or in a deposition chamber, those positioned around and/or in premixing zones, those positioned around and/or in sources of gases, those positioned and/or in tubing fluidically connecting a source of gas with a deposition chamber and/or a premixing zone) and pressure sensors (e.g., those positioned in fluidic communication with one or more of the forementioned locations).

As described above, some embodiments relate to methods. Some methods may relate to methods of forming polymers via PECVD processes. Without wishing to be bound by any particular theory, a PECVD process may comprise employing a plasma to catalyze the polymerization of a monomer. The plasma may supply energy to a volume positioned in a deposition chamber. Initiator molecules and/or monomer molecules present in and/or passing through this volume may absorb some or all of the energy. Absorption of the energy by an initiator and/or a monomer may cause one or more bonds therein may be broken, generating a reactive species. The reactive species may react with monomers to which it is exposed to form a polymer. The polymerization may proceed by a chain-growth mechanism, such as by a free radical polymerization process. The polymerization may ultimately result in the formation of a polymer, which may ultimately deposit on one or more surfaces (e.g., a substrate surface) positioned in the deposition chamber. The polymerization may occur in the gas phase and/or on the surface on which the polymer is deposited (e.g., a substrate surface).

Figure 13:
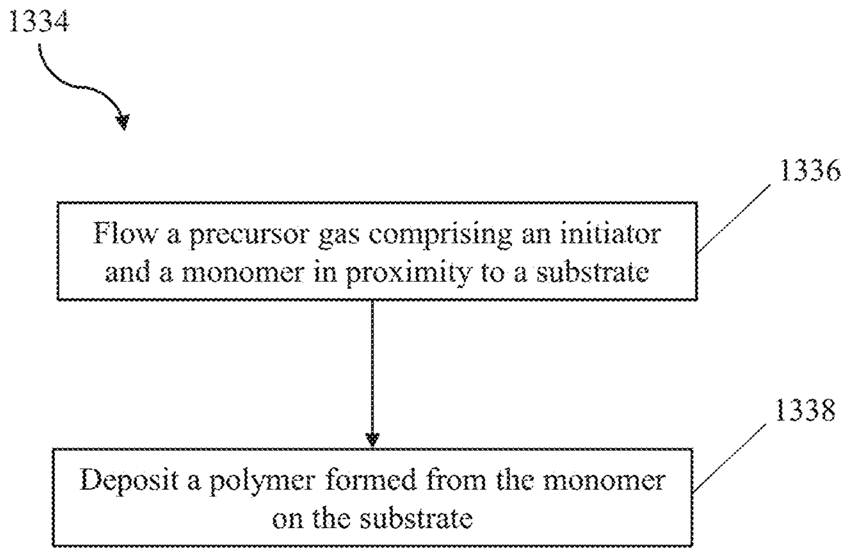
FIG. 13 shows one exemplary method, in accordance with some embodiments.

One exemplary method is shown in FIG. 13. As shown in FIG. 13, a method 1334 may comprise a step 1336 of flowing a precursor gas comprising an initiator and a monomer in proximity to a substrate and a step 1338 of depositing a polymer formed from the monomer on the substrate. While in proximity to the substrate, the precursor gas may be in fluidic communication with the substrate, may contact the substrate, may be capable of adsorbing on the substrate, and/or may be positioned with respect to the substrate such that at least a portion of any polymer forming in the precursor gas may be capable of depositing onto the substrate. The flow may occur in a deposition chamber positioned in a PECVD reactor (e.g., a deposition chamber and/or a PECVD reactor as described elsewhere herein).

In some embodiments, a method according to the process shown in FIG. 13 comprises polymerizing a monomer that comprises one or more desirable functional groups that can be destroyed upon exposure to too much energy. For example, in some embodiments, a method comprises polymerizing a monomer that comprises a cyclic siloxane group. In such instances, it may be desirable to polymerize the monomer (e.g., through one or more other functional groups, such as one or more vinyl groups also present in the monomer) in a manner that retains a high percentage or all of the desirable functional groups (e.g., in a manner that retains a relatively high amount of cyclic siloxane groups in the resultant polymer). This may be accomplished by causing the precursor gas to be exposed to an amount of energy (e.g., an amount of energy supplied by the plasma) sufficient to cause polymerization (e.g., an energy sufficient to cause decomposition of an initiator also present in a precursor gas comprising the monomer) but that is insufficient to destroy the desirable functional groups or that destroys only small amounts of the desirable functional groups present in the monomer. Accordingly, some embodiments comprise exposing a monomer comprising a desirable functional group (e.g., a cyclic siloxane group) and one or more functional groups through which polymerization is desired to occur (e.g., one or more vinyl groups) to an amount of energy (e.g., an amount of plasma energy) sufficient to allow for polymerization at commercially reasonable rates while also retaining a relatively high amount of the desirable functional group (e.g., at a total energy per monomer molecule within a particular range).

In some embodiments, a method according to the process shown in FIG. 13 comprises flowing a precursor gas through a PECVD reactor having one or more of the features described elsewhere herein. As one example, a method may comprise flowing a precursor gas through a deposition chamber positioned in a PECVD reactor having one or more such features, such as a spacing between the plasma electrode and the sidewall to which it is closest to be as small as possible while permitting laminar flow of the precursor gas through the gap between the plasma electrode and the sidewall. Thus, ratio of spacing between a plasma electrode and a sidewall to which it is closest to a spacing between the plasma electrode and the bottom wall is selected to be within a suitable range to allow for laminar flow of the precursor gas.

As described above, in some embodiments, an inlet takes the form of a showerhead. The showerhead may comprise a plurality of apertures in a flat surface. In some embodiments, the plurality of apertures may be positioned around an aperture-free region in the flat surface. FIG. 14 shows one non-limiting embodiment of a showerhead having such a design. In FIG. 14, the apertures are shown by plus signs.

In some embodiments, a PECVD reactor comprises a showerhead that is rectangular and/or square. In some embodiments, one or more sides of the showerhead has a length of about 24 in., optionally one or more sides of the showerhead has a length of about 24 in., 23 in., 22 in., 21 in., or 20 in., or has a length in the range of 10-20 in., or in the range of 15-24 in. In some embodiments, one or more sides of the showerhead has a length or width that is about 50% to about 100%, about 50% to about 60%, about 50% to about 75%, about 60% to about 100%, about 60% to about 70%, or about 60% to about 75% of the length or width of the chamber.

Showerheads may have a variety of suitable numbers of apertures. In some embodiments, a showerhead includes greater than or equal to 100 apertures, greater than or equal to 200 apertures, greater than or equal to 300 apertures, greater than or equal to 400 apertures, greater than or equal to 500 apertures, greater than or equal to 600 apertures, greater than or equal to 711 apertures, greater than or equal to 721 apertures, greater than or equal to 731 apertures, greater than or equal to 741 apertures, greater than or equal to 751 apertures, greater than or equal to 761 apertures, greater than or equal to 771 apertures, greater than or equal to 800 apertures, greater than or equal to 1000 apertures, or greater than or equal to 1250 apertures. In some embodiments, a showerhead includes less than or equal to 1500 apertures, less than or equal to 1250 apertures, less than or equal to 1000 apertures, less than or equal to 800 apertures, less than or equal to 771 apertures, less than or equal to 761 apertures, less than or equal to 751 apertures, less than or equal to 741 apertures, less than or equal to 731 apertures, less than or equal to 721 apertures, less than or equal to 711 apertures, less than or equal to 600 apertures, less than or equal to 500 apertures, less than or equal to 400 apertures, less than or equal to 300 apertures, or less than or equal to 200 apertures. Combinations of the above-referenced ranges are also possible (e.g., greater than or equal to 100 apertures and less than or equal to 1500 apertures, or greater than or equal to 711 apertures and less than or equal to 771 apertures). Other ranges are also possible.

Apertures present in the showerheads described herein may have a variety of suitable areas. In some embodiments, a showerhead comprises apertures having an area of greater than or equal to 0.0004 $in^2$, greater than or equal to 0.0005 $in^2$, greater than or equal to 0.00075 $in^2$, greater than or equal to 0.001 $in^2$, greater than or equal to 0.002 $in^2$, or greater than or equal to 0.005 $in^2$. In some embodiments, a showerhead comprises apertures having an area of less than or equal to 0.0075 $in^2$, less than or equal to 0.005 $in^2$, less than or equal to 0.002 $in^2$, less than or equal to 0.001 $in^2$, less than or equal to 0.00075 $in^2$, or less than or equal to or 0.0005 $in^2$. Combinations of the above-referenced ranges are also possible (e.g., greater than or equal to 0.0004 $in^2$ and less than or equal to 0.0075 $in^2$). Other ranges are also possible.

Apertures may be present in the showerheads described herein at a variety of suitable densities. In some embodiments, apertures are present at a density of greater than or equal to 0.2 apertures per $in^2$, greater than or equal to 0.5 apertures per $in^2$, greater than or equal to 0.75 apertures per $in^2$, greater than or equal to 1 aperture per $in^2$, greater than or equal to 1.5 apertures per $in^2$, greater than or equal to 2 apertures per $in^2$, greater than or equal to 2.5 apertures per $in^2$, or greater than or equal to 3 apertures per $in^2$. In some embodiments, apertures are present at a density of less than or equal to 3.5 apertures per $in^2$, less than or equal to 3 apertures per $in^2$, less than or equal to 2.5 apertures per $in^2$, less than or equal to 2 apertures per $in^2$, less than or equal to 1.5 apertures per $in^2$, less than or equal to 1 aperture per $in^2$, less than or equal to 0.75 apertures per $in^2$, or less than or equal to 0.5 apertures per $in^2$. Combinations of the above-referenced ranges are also possible (e.g., greater than or equal to 0.2 apertures per $in^2$ and less than or equal to 3.5 apertures per $in^2$). Other ranges are also possible.

In some embodiments, a showerhead comprises a plurality of apertures that are positioned around an aperture-free region. In such embodiments, the apertures aperture densities described above may characterize the density of apertures in the region(s) of the showerhead containing apertures. Aperture-free regions may have a characteristic dimension (e.g., a diameter, a side length) that is larger than the spacing between apertures in one or more regions in the showerhead in which apertures are positioned.

One example of an aperture-free region is the region 1440 shown in the exemplary showerhead 1400 depicted in FIG. 14. Aperture free regions may have a variety of suitable shapes. For instance, they may be circular or polygonal (e.g., triangular, square, pentagonal, hexagonal, etc.). Apertures in a plurality of apertures may surround the aperture-free region on one side, two sides, three sides, four sides, and/or all sides of the aperture-free region. In some embodiments, the apertures may be positioned relatively regularly (e.g., with relatively uniform spacing from each other, in a lattice formation) around the aperture-free region. A showerhead may comprise an aperture-free region that is positioned in the center of the showerhead and/or may comprise one or more aperture-free regions that are positioned in one or more locations other than the center of the showerhead.

Aperture-free regions may have a variety of suitable areas. In some embodiments, an aperture-free region has an area of greater than or equal to 18 $in^2$, greater than or equal to 20 $in^2$, greater than or equal to 50 $in^2$, greater than or equal to 73 $in^2$, greater than or equal to 100 $in^2$, greater than or equal to 125 $in^2$, or greater than or equal to 150 $in^2$. In some embodiments, an aperture-free region has an area of less than or equal to 200 $in^2$, less than or equal to 150 $in^2$, less than or equal to 125 $in^2$, less than or equal to 100 $in^2$, less than or equal to 73 $in^2$, less than or equal to 50 $in^2$, or less than or equal to 20 $in^2$. Combinations of the above-referenced ranges are also possible (e.g., greater than or equal to 18 $in^2$ and less than or equal to 200 $in^2$). Other ranges are also possible.

Aperture-free regions may make up a variety of suitable percentages of the showerhead. In some embodiments, an aperture-free region makes up greater than or equal to 3%, greater than or equal to 5%, greater than or equal to 7.5%, greater than or equal to 10%, greater than or equal to 15%, greater than or equal to 20%, greater than or equal to 25%, or greater than or equal to 30% of the showerhead. In some embodiments, an aperture-free region makes up less than or equal to 35%, less than or equal to 30%, less than or equal to 25%, less than or equal to 20%, less than or equal to 15%, less than or equal to 10%, less than or equal to 7.5%, or less than or equal to 5% of the showerhead. Combinations of the above-referenced ranges are also possible (e.g., greater than or equal to 3% and less than or equal to 35%). Other ranges are also possible.

As described above, in some embodiments, one or more dimensions of a PECVD reactor are selected to enhance precursor gas flowthrough and/or polymer deposition. Some examples of such dimensions are described in further detail below.

In some embodiments, a PECVD reactor comprises a premixing zone, and the relative volumes of the premixing zone and the deposition chamber are advantageous. These relative volumes may be such that the premixing zone is large enough for good mixing between the gases flowing therethrough. In some embodiments, the ratio of the volume of the premixing zone to the volume of the deposition chamber is greater than or equal to 0.06, greater than or equal to 0.07, greater than or equal to 0.08, greater than or equal to 0.09, greater than or equal to 0.1, greater than or equal to 0.11, greater than or equal to 0.12, greater than or equal to 0.13, or greater than or equal to 0.14. In some embodiments, the ratio of the volume of the premixing zone to the volume of the deposition chamber is less than or equal to 0.15, less than or equal to 0.14, less than or equal to 0.13, less than or equal to 0.12, less than or equal to 0.1, less than or equal to 0.09, less than or equal to 0.08, or less than or equal to 0.07. Combinations of the above-referenced ranges are also possible (e.g., greater than or equal to 0.06 and less than or equal to 0.15). Other ranges are also possible.

Premixing zones may have any suitable dimensions. As described above, in some embodiments, a premixing zone may be separated from a deposition chamber by an inlet. In some embodiments, a premixing zone takes the form of a right rectangular prism. In some embodiments, a premixing zone is enclosed by one or more walls that are movable. For instance, a premixing zone may be enclosed by five walls that are stationary and one wall that is movable. In such embodiments, as described above, the volume of the premixing zone may be adjusted by moving the movable wall. In some such embodiments, the four non-movable walls enclose a square (e.g., a 24"×24" square). It is also possible for the four non-movable walls to enclose other shapes, such as cylinders. The movable wall may be capable of being positioned at distances from its opposing wall that range from 1.5" to 3.5". In some embodiments, the movable wall may take the form of an inlet, such as an inlet that is also a ground electrode and/or a showerhead.

In some embodiments, a premixing zone is fully enclosed on all sides by a plurality of walls. In other words, in some embodiments, a premixing zone lacks open sides through which gas can freely enter or exit and lacks spaces or junctions between walls through which gas can freely enter or exit. In some embodiments, the walls enclosing a premixing zone cause the deposition chamber to be gas-tight. It is also possible for the walls to meet at gas-tight junctions and/or to enclose the premixing zone such that the only manner in which gas can enter the premixing zone is through one or more inlets and/or such that the only manner in which gas can exit the premixing zone is through one or more outlets (which, themselves, may serve as inlets into a deposition chamber). In some embodiments, the walls enclose the premixing zone in a manner that allows for the pressure inside the premixing zone to be maintained at a value that is different from the pressure in an environment enclosing the premixing zone and/or at a value that is substantially uniform.

In some embodiments, a plasma electrode may be spaced from the bottom wall of the deposition chamber at an advantageous value. In some embodiments, the spacing between the bottom wall and the plasma electrode is greater than or equal to 2 inches, greater than or equal to 2.5 inches, greater than or equal to 3 inches, greater than or equal to 3.5 inches, or greater than or equal to 4 inches, greater than or equal to 4.5 inches. In some embodiments, the spacing between the bottom wall and the plasma electrode is less than or equal to 5 inches, less than or equal to 4.5 inches, less than or equal to 4 inches, less than or equal to 3.5 inches, less than or equal to 3 inches, or less than or equal to 2.5 inches. Combinations of the above-referenced ranges are also possible (e.g., greater than or equal to 2 inches and less than or equal to 5 inches).

Other ranges are also possible.

Figure 16:
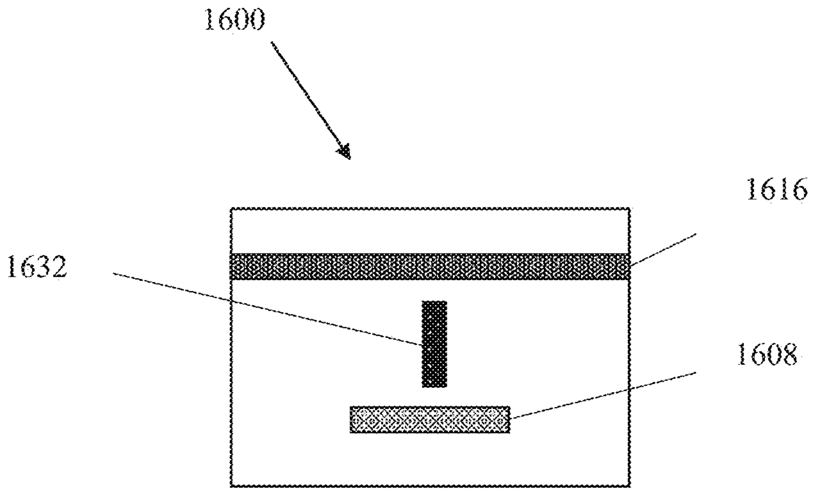
FIG. 16 shows a non-limiting embodiment of a substrate positioned in a deposition chamber, in accordance with some embodiments.

A schematic of the positioning of the substrate 1632 in the deposition chamber 1600 is shown in FIG. 16. The substrate 1632 is located between the ground electrode 1616 and the plasma electrode 1608. Optionally, the ground electrode also serves as an inlet to the deposition chamber. Optionally the ground electrode 1616 is in the form of a showerhead, such as described above. The showerhead can have any suitable configuration; optionally the showerhead has a configuration as depicted in FIG. 14.

Figure 15:
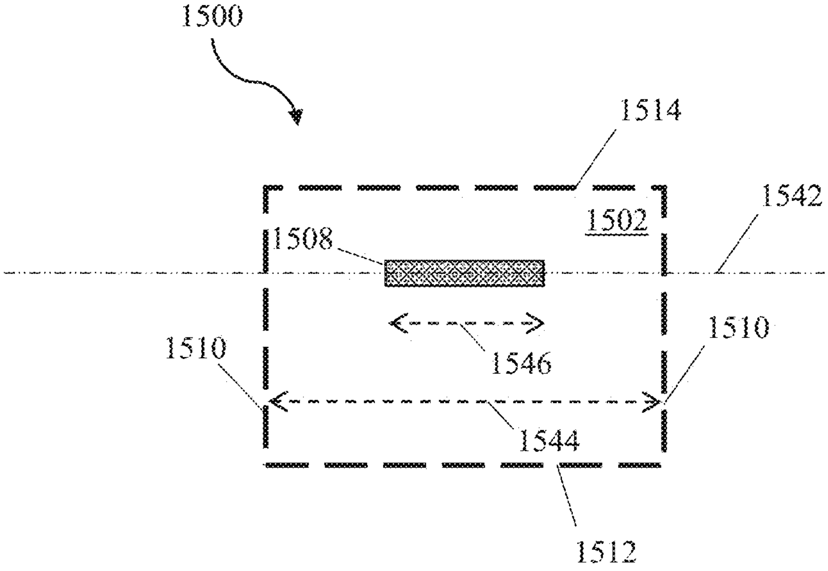
FIG. 15 shows a further non-limiting embodiment of a PECVD reactor, in accordance with some embodiments.

In some embodiments, a plasma electrode occupies a relatively large amount of the cross-sectional area of the deposition chamber. This may be parametrized as the amount of the area that is parallel to the bottom wall of the deposition chamber and interior to the deposition chamber in the plane that the plasma electrode occupies the largest fraction of. With respect to FIG. 15, this may be the fraction of the area of the plane 1542 interior to the deposition chamber that is parallel to the plane that is occupied by the plasma electrode 1508. In FIG. 15, the area of the plane 1542 interior to the deposition chamber is shown by 1544 and the fraction occupied by the plasma electrode is shown by 1546.

A plasma electrode may occupy greater than or equal to 80%, greater than or equal to 82.5%, greater than or equal to 85%, greater than or equal to 87.5%, greater than or equal to 90%, greater than or equal to 92.5%, or greater than or equal to 95% of the cross-sectional area of the deposition chamber. A plasma electrode may occupy less than or equal to 97.5%, less than or equal to 95%, less than or equal to 92.5%, less than or equal to 90%, less than or equal to 87.5%, less than or equal to 85%, or less than or equal to 82.5% of the cross-sectional area of the deposition chamber. Combinations of the above-referenced ranges are also possible (e.g., greater than or equal to 82.5% and less than or equal to 97.5%). Other ranges are also possible.

Deposition chambers may have a variety of suitable total volumes. In some embodiments, a deposition chamber has an internal volume (i.e., a volume enclosed by its walls) of greater than or equal to 3000 $in^3$, greater than or equal to 5000 $in^3$, greater than or equal to 7500 $in^3$, greater than or equal to 10000 $in^3$, greater than or equal to 20000 $in^3$, greater than or equal to 30000 $in^3$, greater than or equal to 40000 $in^3$, greater than or equal to 50000 $in^3$, or greater than or equal to 60000 $in^3$. In some embodiments, a deposition chamber has an internal volume of less than or equal to 70000 $in^3$, less than or equal to 60000 $in^3$, less than or equal to 50000 $in^3$, less than or equal to 40000 $in^3$, less than or equal to 30000 $in^3$, less than or equal to 20000 $in^3$, less than or equal to 10000 $in^3$, less than or equal to 7500 $in^3$, or less than or equal to 5000 $in^3$. Combinations of the above-referenced ranges are also possible (e.g., greater than or equal to 3000 $in^3$ and less than or equal to 70000 $in^3$). Other ranges are also possible.

As described above, in some embodiments, a PECVD reactor is configured such that a polymer can be deposited on a substrate under favorable conditions and some methods comprise depositing polymers on substrates under favorable conditions. Some examples of such conditions are described in further detail below.

In some embodiments, a monomer molecule is exposed to a total energy while flowing through the deposition chamber that is in an advantageous range and/or a PECVD system comprises a control system configured to expose a monomer to a total energy that is in an advantageous range. In some embodiments, the total energy to which a monomer molecule is exposed while flowing within a deposition chamber is greater than or equal to $1.5\times10^{-24}$ J/molecule, greater than or equal to $1.75\times10^{-24}$ J/molecule, greater than or equal to $2\times10^{-24}$ J/molecule, greater than or equal to $2.25\times10^{-24}$ J/molecule, greater than or equal to $2.5\times10^{-24}$ J/molecule, greater than or equal to $2.75\times10^{-24}$ J/molecule, greater than or equal to $3\times10^{-24}$ J/molecule, greater than or equal to $4\times10^{-24}$ J/molecule, greater than or equal to $4\times10^{-24}$ J/molecule, greater than or equal to $6\times10^{-24}$ J/molecule, greater than or equal to $7\times10^{-24}$ J/molecule, greater than or equal to $8\times10^{-24}$ J/molecule, greater than or equal to $9\times10^{-24}$ J/molecule, greater than or equal to $10\times10^{-24}$ J/molecule, greater than or equal to $11\times10^{-24}$ J/molecule, greater than or equal to $12\times10^{-24}$ J/molecule, greater than or equal to $15\times10^{-24}$ J/molecule, greater than or equal to $17\times10^{-24}$ J/molecule, greater than or equal to $20\times10^{-24}$ J/molecule, greater than or equal to $22\times10^{-24}$ J/molecule, greater than or equal to $25\times10^{-24}$ J/molecule, greater than or equal to $27\times10^{-24}$ J/molecule, greater than or equal to $30\times10^{-24}$ J/molecule, greater than or equal to $31\times10^{-24}$ J/molecule, or greater than or equal to $31.5\times10^{-24}$ J/molecule. In some embodiments, the total energy to which a monomer is exposed while flowing within a deposition chamber is less than or equal to $32\times10^{-24}$ J/molecule, less than or equal to $31.7\times10^{-24}$ J/molecule, less than or equal to $31.5\times10^{-24}$ J/molecule, less than or equal to $30\times10^{-24}$ J/molecule, less than or equal to $27.5\times10^{-24}$ J/molecule, less than or equal to $25\times10^{-24}$ J/molecule, less than or equal to $23\times10^{-24}$ J/molecule, less than or equal to $22.5\times10^{-24}$ J/molecule, less than or equal to $22\times10^{-24}$ J/molecule, less than or equal to $20\times10^{-24}$ J/molecule, less than or equal to $17.5\times10^{-24}$ J/molecule, less than or equal to $15\times10^{-24}$ J/molecule, less than or equal to $12\times10^{-24}$ J/molecule, less than or equal to $10\times10^{-24}$ J/molecule, less than or equal to $8\times10^{-24}$ J/molecule, less than or equal to $6.5\times10^{-24}$ J/molecule, less than or equal to $6.4\times10^{-24}$ J/molecule, less than or equal to $6\times10^{-24}$ J/molecule, less than or equal to $5\times10^{-24}$ J/molecule, less than or equal to $4\times10^{-24}$ J/molecule, less than or equal to $3.5\times10^{-24}$ J/molecule, or less than or equal to $2\times10^{-24}$ J/molecule. Combinations of the above-referenced ranges are also possible (e.g., greater than or equal to $1.5\times10^{-24}$ J/molecule and less than or equal to $32\times10^{-24}$ J/molecule, greater than or equal to $1.5\times10^{-24}$ J/molecule and less than or equal to $31.7\times10^{-24}$ J/molecule, greater than or equal to $1.5\times10^{-24}$ J/molecule and less than or equal to $31.5\times10^{-24}$ J/molecule, greater than or equal to $1.5\times10^{-24}$ J/molecule and less than or equal to $30\times10^{-24}$ J/molecule, greater than or equal to $1.5\times10^{-24}$ J/molecule and less than or equal to $25\times10^{-24}$ J/molecule, greater than or equal to $1.5\times10^{-24}$ J/molecule and less than or equal to $20\times10^{-24}$ J/molecule, greater than or equal to $1.5\times10^{-24}$ J/molecule and less than or equal to $15\times10^{-24}$ J/molecule, greater than or equal to $1.5\times10^{-24}$ J/molecule and less than or equal to $10\times10^{-24}$ J/molecule, greater than or equal to $1.5\times10^{-24}$ J/molecule and less than or equal to $8\times10^{-24}$ J/molecule, greater than or equal to $1.5\times10^{-24}$ J/molecule and less than or equal to $6.5\times10^{-24}$ J/molecule, greater than or equal to $1.5\times10^{-24}$ J/molecule and less than or equal to $6.4\times10^{-24}$ J/molecule, greater than or equal to $1.5\times10^{-24}$ J/molecule and less than or equal to $5\times10^{-24}$ J/molecule, greater than or equal to $2\times10^{-24}$ J/molecule and less than or equal to $32\times10^{-24}$ J/molecule, greater than or equal to $2\times10^{-24}$ J/molecule and less than or equal to $31.7\times10^{-24}$ J/molecule, greater than or equal to $2\times10^{-24}$ J/molecule and less than or equal to $31.5\times10^{-24}$ J/molecule, greater than or equal to $2\times10^{-24}$ J/molecule and less than or equal to $30\times10^{-24}$ J/molecule, greater than or equal to $2\times10^{-24}$ J/molecule and less than or equal to $25\times10^{-24}$ J/molecule, greater than or equal to $2\times10^{-24}$ J/molecule and less than or equal to $20\times10^{-24}$ J/molecule, greater than or equal to $2\times10^{-24}$ J/molecule and less than or equal to $15\times10^{-24}$ J/molecule, greater than or equal to $2\times10^{-24}$ J/molecule and less than or equal to $10\times10^{-24}$ J/molecule, greater than or equal to $2\times10^{-24}$ J/molecule and less than or equal to $8\times10^{-24}$ J/molecule, greater than or equal to $2\times10^{-24}$ J/molecule and less than or equal to $6.5\times10^{-24}$ J/molecule, greater than or equal to $2\times10^{-24}$ J/molecule and less than or equal to $6.4\times10^{-24}$ J/molecule, greater than or equal to $2\times10^{-24}$ J/molecule and less than or equal to $5\times10^{-24}$ J/molecule, greater than or equal to $6\times10^{-24}$ J/molecule and less than or equal to $32\times10^{-24}$ J/molecule, greater than or equal to $6\times10^{-24}$ J/molecule and less than or equal to $31.7\times10^{-24}$ J/molecule, greater than or equal to $6\times10^{-24}$ J/molecule and less than or equal to $31.5\times10^{-24}$ J/molecule, greater than or equal to $6\times10^{-24}$ J/molecule and less than or equal to $30\times10^{-24}$ J/molecule, greater than or equal to $6\times10^{-24}$ J/molecule and less than or equal to $25\times10^{-24}$ J/molecule, greater than or equal to $6\times10^{-24}$ J/molecule and less than or equal to $20\times10^{-24}$ J/molecule, greater than or equal to $6\times10^{-24}$ J/molecule and less than or equal to $15\times10^{-24}$ J/molecule, greater than or equal to $6\times10^{-24}$ J/molecule and less than or equal to $10\times10^{-24}$ J/molecule, greater than or equal to $6\times10^{-24}$ J/molecule and less than or equal to $8\times10^{-24}$ J/molecule, greater than or equal to $6\times10^{-24}$ J/molecule and less than or equal to $6.5\times10^{-24}$ J/molecule, greater than or equal to $6\times10^{-24}$ J/molecule and less than or equal to $6.4\times10^{-24}$ J/molecule, greater than or equal to $6\times10^{-24}$ J/molecule and less than or equal to $5\times10^{-24}$ J/molecule, greater than or equal to $10\times10^{-24}$ J/molecule and less than or equal to $32\times10^{-24}$ J/molecule, greater than or equal to $10\times10^{-24}$ J/molecule and less than or equal to $31.7\times10^{-24}$ J/molecule, greater than or equal to $10\times10^{-24}$ J/molecule and less than or equal to $31.5\times10^{-24}$ J/molecule, greater than or equal to $10\times10^{-24}$ J/molecule and less than or equal to $30\times10^{-24}$ J/molecule, greater than or equal to $10\times10^{-24}$ J/molecule and less than or equal to $25\times10^{-24}$ J/molecule, greater than or equal to $10\times10^{-24}$ J/molecule and less than or equal to $20\times10^{-24}$ J/molecule, greater than or equal to $10\times10^{-24}$ J/molecule and less than or equal to $15\times10^{-24}$ J/molecule, greater than or equal to $15\times10^{-24}$ J/molecule and less than or equal to $32\times10^{-24}$ J/molecule, greater than or equal to $15\times10^{-24}$ J/molecule and less than or equal to $31.7\times10^{-24}$ J/molecule, greater than or equal to $15\times10^{-24}$ J/molecule and less than or equal to $31.5\times10^{-24}$ J/molecule, greater than or equal to $15\times10^{-24}$ J/molecule and less than or equal to $30\times10^{-24}$ J/molecule, greater than or equal to $15\times10^{-24}$ J/molecule and less than or equal to $25\times10^{-24}$ J/molecule, or greater than or equal to $15\times10^{-24}$ J/molecule and less than or equal to $20\times10^{-24}$ J/molecule). Other ranges are also possible.

The energy to which a monomer is exposed while flowing through a deposition chamber may be determined by solving the following equation:

$$\text{Energy per monomer} = (\text{power density}) \times (\text{volume per monomer molecule}) \times (\text{precursor gas residence time})$$

where the "volume per monomer molecule" is as calculated by the ideal gas law.

When two or more monomers flow through a deposition chamber and/or a PECVD reactor is configured such that two or more monomers flow through a deposition chamber, each monomer molecule may independently be exposed to a total energy in one or more of the above-referenced ranges.

Energy present in the deposition chambers described herein may be supplied by plasma electrodes positioned therein. In some embodiments, a plasma electrode positioned in a deposition chamber supplies plasma at a power of and/or is configured to supply plasma at a power of less than or equal to 1000 W, less than or equal to 750 W, less than or equal to 500 W, less than or equal to 200 W, less than or equal to 100 W, less than or equal to 75 W, less than or equal to 50 W, less than or equal to 20 W, less than or equal to 10 W, less than or equal to 7.5 W, less than or equal to 5 W, or less than or equal to 2 W. In some embodiments, a plasma electrode positioned in a deposition chamber supplies plasma at a power of and/or is configured to supply plasma at a power of greater than or equal to 1 W, greater than or equal to 2 W, greater than or equal to 5 W, greater than or equal to 7.5 W, greater than or equal to 10 W, greater than or equal to 20 W, greater than or equal to 50 W, greater than or equal to 75 W, greater than or equal to 100 W, greater than or equal to 200 W, greater than or equal to 500 W, or greater than or equal to 750 W. Combinations of the above-referenced ranges are also possible (e.g., greater than or equal to 1 W and less than or equal to 1000 W). Other ranges are also possible.

In some embodiments, a plasma electrode positioned in a deposition chamber supplies plasma at a power density of and/or is configured to supply plasma at a power density of less than or equal to less than or equal to 1 mW/cm$^3$, less than or equal to 0.8 mW/cm$^3$, less than or equal to 0.7 mW/cm$^3$, less than or equal to 0.65 mW/cm$^3$, less than or equal to 0.6 mW/cm$^3$, less than or equal to 0.45 mW/cm$^3$, less than or equal to 0.3 mW/cm$^3$, less than or equal to 0.12 mW/cm$^3$, or less than or equal to 0.06 mW/cm$^3$. In some embodiments, a plasma electrode positioned in a deposition chamber supplies plasma at a power density of and/or is configured to supply plasma at a power density of greater than or equal to 0.004 mW/cm$^3$, greater than or equal to 0.01 mW/cm$^3$, greater than or equal to 0.02 mW/cm$^3$, greater than or equal to 0.03 mW/cm$^3$, greater than or equal to 0.04 mW/cm$^3$, greater than or equal to 0.05 mW/cm$^3$, greater than or equal to 0.06 mW/cm$^3$, greater than or equal to 0.08 mW/cm$^3$, greater than or equal to 0.1 mW/cm$^3$, greater than or equal to 0.12 mW/cm$^3$, greater than or equal to 0.15 mW/cm$^3$, greater than or equal to 0.2 mW/cm$^3$, greater than or equal to 0.25 mW/cm$^3$, or greater than or equal to 0.3 mW/cm$^3$. Combinations of the above-referenced ranges are also possible (e.g., greater than or equal to 0.01 mW/cm$^3$ and less than or equal to 0.7 mW/cm$^3$, greater than or equal to 0.01 mW/cm$^3$ and less than or equal to 0.65 mW/cm$^3$, greater than or equal to 0.01 mW/cm$^3$ and less than or equal to 0.6 mW/cm$^3$, greater than or equal to 0.01 mW/cm$^3$ and less than or equal to 0.59 $mW/cm^3$, greater than or equal to 0.01 $mW/cm^3$ and less than or equal to 0.58 $mW/cm^3$, greater than or equal to 0.01 $mW/cm^3$ and less than or equal to 0.55 $mW/cm^3$, greater than or equal to 0.01 $mW/cm^3$ and less than or equal to 0.6 $mW/cm^3$. Other ranges are also possible.

In some embodiments, the plasma intensity in a deposition chamber is relatively uniform. For instance, in some embodiments, less than or equal to a first percentage of the volume interior to the deposition chamber has a plasma intensity that is greater than or equal to a second percentage different from the average plasma intensity in the deposition chamber. In some embodiments, the first percentage is 1%, 2%, 3%, 4%, 5%, 6%, 7%, 8%, 9%, or 10%. In some embodiments, the second percentage is 1%, 2%, 5%, 7.5%, 10%, 12.5%, 15%, 17.5%, 20%, 22.5%, or 25%. For instance, in some embodiments, less than or equal to 1% of the volume interior to the deposition chamber has a plasma intensity that is greater than or equal to 1% different from the average plasma intensity in the deposition chamber. As another example, in some embodiments, less than or equal to 10% of the volume interior to the deposition chamber has a plasma intensity that is greater than or equal to 25% different from the average plasma intensity in the deposition chamber.

In some embodiments, the flow of a precursor gas through a deposition chamber and/or outlet is substantially laminar. In some embodiments, greater than or equal to 90%, greater than or equal to 95%, greater than or equal to 98%, or greater than or equal to 99% of the flow of the precursor gas through the deposition chamber and/or out an outlet is laminar. In some embodiments, less than or equal to 100%, less than or equal to 99%, less than or equal to 98%, or less than or equal to 95% of the flow of the precursor gas through the deposition chamber and/or out an outlet is laminar. Combinations of the above-referenced ranges are also possible (e.g., greater than or equal to 90% and less than or equal to 100%). In some embodiments, 100% of the flow of the precursor gas through the deposition chamber and/or out an outlet is laminar. The percentage of the flow that is laminar may be determined by calculating the Reynolds number.

A precursor gas may be supplied to a deposition chamber, may flow in a deposition chamber, and/or may flow through a deposition chamber at a variety of suitable rates. In some embodiments, a precursor gas is supplied to a deposition chamber, flows in a deposition chamber, and/or flows through a deposition chamber at a flow rate of greater than or equal to 0.01 sccm, greater than or equal to 0.02 sccm, greater than or equal to 0.05 sccm, greater than or equal to 0.075 sccm, greater than or equal to 0.1 sccm, greater than or equal to 0.2 sccm, greater than or equal to 0.5 sccm, greater than or equal to 0.75 sccm, greater than or equal to 1 sccm, greater than or equal to 2 sccm, greater than or equal to 5 sccm, greater than or equal to 7.5 sccm, greater than or equal to 10 sccm, greater than or equal to 20 sccm, greater than or equal to 50 sccm, greater than or equal to 75 sccm, greater than or equal to 100 sccm, or greater than or equal to 200 sccm. In some embodiments, a precursor gas is supplied to a deposition chamber, flows in a deposition chamber, and/or flows through a deposition chamber at a flow rate of less than or equal to 250 sccm, less than or equal to 200 sccm, less than or equal to 100 sccm, less than or equal to 75 sccm, less than or equal to 50 sccm, less than or equal to 20 sccm, less than or equal to 10 sccm, less than or equal to 7.5 sccm, less than or equal to 5 sccm, less than or equal to 2 sccm, less than or equal to 1 sccm, less than or equal to 0.75 sccm, less than or equal to 0.5 sccm, less than or equal to 0.2 sccm, less than or equal to 0.1 sccm, less than or equal to 0.075 sccm, less than or equal to 0.05 sccm, or less than or equal to 0.02 sccm. Combinations of the above-referenced ranges are also possible (e.g., greater than or equal to 0.01 sccm and less than or equal to 250 sccm, or greater than or equal to 0.01 sccm and less than or equal to 50 sccm). Other ranges are also possible.

A precursor gas may have a variety of suitable residence times in a deposition chamber. In some embodiments, a precursor gas has a residence time in a deposition chamber of greater than or equal to 1 second, greater than or equal to 2 seconds, greater than or equal to 5 seconds, greater than or equal to 7.5 seconds, greater than or equal to 10 seconds, greater than or equal to 15 seconds, greater than or equal to 20 seconds, greater than or equal to 25 seconds, greater than or equal to 30 seconds, greater than or equal to 35 seconds, greater than or equal to 40 seconds, greater than or equal to 45 seconds, greater than or equal to 50 seconds, or greater than or equal to 55 seconds. In some embodiments, a precursor gas has a residence time in a deposition chamber of less than or equal to 60 seconds, less than or equal to 55 seconds, less than or equal to 50 seconds, less than or equal to 45 seconds, less than or equal to 40 seconds, less than or equal to 35 seconds, less than or equal to 30 seconds, less than or equal to 25 seconds, less than or equal to 20 seconds, less than or equal to 15 seconds, less than or equal to 10 seconds, less than or equal to 7.5 seconds, less than or equal to 5 seconds, or less than or equal to 2 seconds. Combinations of the above-referenced ranges are also possible (e.g., greater than or equal to 1 second and less than or equal to 60 seconds). Other ranges are also possible.

The deposition chambers described herein may be held at a variety of suitable pressures during the deposition of polymers therein. In some embodiments, the pressure in a deposition chamber is less than or equal to 50 mTorr, less than or equal to 40 mTorr, less than or equal to 30 mTorr, or less than or equal to 20 mTorr. In some embodiments, the pressure in a deposition chamber is greater than or equal to 10 mTorr, greater than or equal to 20 mTorr, greater than or equal to 30 mTorr, or greater than or equal to 40 mTorr. Combinations of the above-referenced ranges are also possible (e.g., greater than or equal to 10 mTorr and less than or equal to 50 mTorr). Other ranges are also possible.

The partial pressures of various species present in a precursor gas flowing in a deposition chamber and/or may through a deposition chamber may have a variety of suitable values. In some embodiments, a species present in such a precursor gas is present at a partial pressure of less than or equal to 50 mTorr, less than or equal to 40 mTorr, less than or equal to 30 mTorr, less than or equal to 20 mTorr, less than or equal to 10 mTorr, less than or equal to 7.5 mTorr, less than or equal to 5 mTorr, less than or equal to 2 mTorr, less than or equal to 1 mTorr, less than or equal to 0.75 mTorr, less than or equal to 0.5 mTorr, less than or equal to 0.2 mTorr, less than or equal to 0.1 mTorr, less than or equal to 0.075 mTorr, or less than or equal to 0.05 mTorr. In some embodiments, a species present in such a precursor gas is present at a partial pressure of greater than or equal to 0.02 mTorr, greater than or equal to 0.05 mTorr, greater than or equal to 0.075 mTorr, greater than or equal to 0.1 mTorr, greater than or equal to 0.2 mTorr, greater than or equal to 0.5 mTorr, greater than or equal to 0.75 mTorr, greater than or equal to 1 mTorr, greater than or equal to 2 mTorr, greater than or equal to 5 mTorr, greater than or equal to 7.5 mTorr, greater than or equal to 10 mTorr, greater than or equal to 20 mTorr, greater than or equal to 30 mTorr, or greater than or equal to 40 mTorr. Combinations of the above-referenced ranges are also possible (e.g., greater than or equal to 0.02 mTorr and less than or equal to 50 mTorr, or greater than or equal to 0.02 mTorr and less than or equal to 10 mTorr). Other ranges are also possible.

Each species present in a precursor gas (e.g., each monomer, each initiator, each carrier gas) may independently be present at a partial pressure in one or more of the ranges provided above.

A polymer may deposit on a substrate at a variety of suitable rates. In some embodiments, a polymer deposits on a substrate at a rate of greater than or equal to 0.01 nm/min, greater than or equal to 0.02 nm/min, greater than or equal to 0.05 nm/min, greater than or equal to 0.075 nm/min, greater than or equal to 1 nm/min, greater than or equal to 0.2 nm/min, greater than or equal to 0.5 nm/min, greater than or equal to 0.75 nm/min, greater than or equal to 1 nm/min, greater than or equal to 2 nm/min, greater than or equal to 5 nm/min, greater than or equal to 7.5 nm/min, greater than or equal to 10 nm/min, greater than or equal to 20 nm/min, greater than or equal to 50 nm/min, or greater than or equal to 75 nm/min. In some embodiments, a polymer deposits on a substrate at a rate of less than or equal to 100 nm/min, less than or equal to 75 nm/min, less than or equal to 50 nm/min, less than or equal to 20 nm/min, less than or equal to 10 nm/min, less than or equal to 7.5 nm/min, less than or equal to 5 nm/min, less than or equal to 2 nm/min, less than or equal to 1 nm/min, less than or equal to 0.75 nm/min, less than or equal to 0.5 nm/min, less than or equal to 0.2 nm/min, less than or equal to 0.1 nm/min, less than or equal to 0.075 nm/min, less than or equal to 0.05 nm/min, or less than or equal to 0.02 nm/min. Combinations of the above-referenced ranges are also possible (e.g., greater than or equal to 0.01 nm/min and less than or equal to 100 nm/min). Other ranges are also possible.

The deposition rate of a polymer may be measured by interferometry.

When a polymer is depositing on more than one surface of a substrate, the rate at which it deposits on each surface may independently be in one or more of the above-referenced ranges and/or the overall average rate at which it deposits on the substrate may be in one or more of the above-referenced ranges.

Precursor Gas

The precursor gases from which the polymers described herein may be formed and/or the are flown through the deposition chambers described herein may have a variety of suitable properties, which are described in further detail below.

In some embodiments, a precursor gas comprises a monomer. In some embodiments, one type of monomer is polymerized, two types or monomers are polymerized, or three or more types of monomers are polymerized. Generally, at least one type of monomer comprises a cyclic siloxane group. The term cyclic siloxane group is given its ordinary meaning in the art and refers to an organosilicon compound comprising a suitable cyclic moiety of the structure [—Si(R)$_2$—O-]$_m$, wherein m is 3, 4, 5, 6, or more, and R is any suitable group. In some embodiments, each type of monomer comprises a cyclic siloxane group. In some embodiments, a monomer comprises three siloxane repeat units, four siloxane repeat units, five siloxane repeat units, six siloxane repeat units, or more. In some embodiments, a monomer comprises at one or more vinyl groups. In some embodiments, the monomers may comprise one vinyl group, two vinyl groups, three vinyl groups, or four vinyl groups. In some embodiments, a monomer comprises two vinyl groups. In some embodiments, a monomer comprises three vinyl groups. A non-limiting example of a monomer comprising a cyclic siloxane group has the structure of Formula (I):

(I)

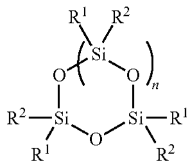

wherein each $R^1$ and $R^2$ is the same or different and is independently substituted or unsubstituted alkyl or substituted or unsubstituted alkene, and n is 1, 2, 3, 4, 5, or 6, or may comprise a bond to another linear or cyclic siloxane group (e.g., $R^1$ and/or $R^2$ may be —O—Si—). In some embodiments, each $R^1$ and $R^2$ is the same or different and is unsubstituted alkyl or is unsubstituted alkene, and n is 1, 2, 3, 4, 5, or 6. In some embodiments, at least one $R^1$ and/or $R^2$ is unsubstituted alkene (e.g., vinyl). In some embodiments, at least two $R^1$ and/or $R^2$ is unsubstituted alkene (e.g., vinyl). In some embodiments, at least three $R^1$ and/or $R^2$ is unsubstituted alkene (e.g., vinyl). In some embodiments, each $R^1$ is unsubstituted alkyl and each $R^2$ is unsubstituted alkene. In some embodiments, each $R^1$ comprises at least one Si—O bond and each $R^2$ is unsubstituted alkene. In some embodiments, each $R^1$ is methyl and each $R^2$ is vinyl. In some embodiments, n is 1. In some embodiments, n is 2. In some embodiments, n is 3. In some embodiments, n is 4. In some embodiments, n is 1, each $R^1$ is methyl and each $R^2$ is vinyl (i.e., $CHCH_2$). In some embodiments, n is 1, each $R^1$ is methyl and each $R^2$ is vinyl. Non-limiting examples of monomers comprising a cyclic siloxane group and at least two vinyl groups are trivinyltrimethylcyclotrisiloxane, tetravinyltetramethylcyclotetrasiloxane, and trivinylpentamethyltrisiloxane, which have the following chemical formulae:

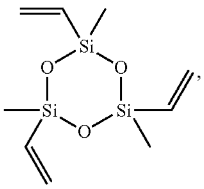

,

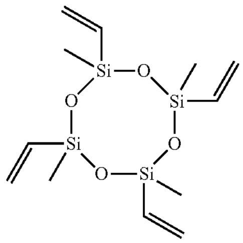

, and

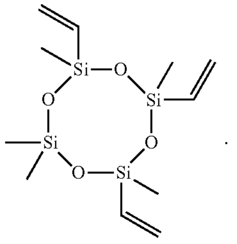

.

In some embodiments, a precursor gas comprises one or more initiators. In some embodiments, initiator(s) may comprise one or more groups which are capable of generating free radicals under the experimental conditions. In accordance with some embodiments, such free radicals may be capable of reacting with monomers to form growing polymer chains. According to certain embodiments, initiators may be capable of decomposing to form one or more molecules comprising a free radical. In certain embodiments, initiators may comprise functional groups which are capable of forming radicals under the experimental conditions (e.g., by decomposing). Non-limiting examples of suitable functional groups include peroxide groups, persulfate groups, and azo groups. In some embodiments, the initiator may comprise one or more of tert-butyl peroxide and tert-amyl peroxide.

According to certain embodiments, a precursor gas comprises one or more carrier gases. In some embodiments, such carrier gases do not participate in the polymerization. In some embodiments, a precursor gas comprises a carrier gas that is an inert gas. In some embodiments, one type of inert gas, two types of inert gases, three types of inert gases, or more, may be present in the precursor gas. Non-limiting examples of inert gases include nitrogen, helium, and argon.

Polymer Formed in the PECVD Reactor

The polymers deposited by the methods described herein and/or that may be formed in the PECVD reactors described herein may have a variety of suitable properties, which are described in further detail below.

The polymers deposited by the methods described herein and/or that may be formed in the PECVD reactors described herein may be formed upon and/or by the polymerization of monomers in a precursor gas. Accordingly, they may comprise reaction products of any initiators and/or monomers present in a precursor gas. In some embodiments, a polymer deposited by a method described herein and/or that may be formed in the PECVD reactor described herein comprises a plurality of repeat units that take the form of a reaction product of a polymerized monomer described above (e.g., a polymerized monomer comprising a cyclic siloxane group, such as trivinyltrimethylcyclotrisiloxane, tetravinyltetramethylcyclotetrasiloxane, and/or trivinylpentamethyltrisiloxane). It should be understood that the polymer formed comprising the monomers described herein or formed from the monomers described herein may comprise other components. In addition, as would be understood by a person of skill in the art, monomers may undergo one or more chemical modifications during a polymerization process (e.g., a vinyl group may react with a growing polymer chain to produce a single bond bonded to the growing polymer chain and a free radical, which itself may react with further species during the polymerization process), and thus, one or more of the bonds present in a monomer may not be present in the repeat units of a polymer formed from the monomer.

In some embodiments, a polymer deposited by a method described herein and/or formed in a PECVD reactor described herein has a relatively high amount cyclic siloxane groups as a percentage of all of the siloxane groups in the polymer. Without wishing to be bound by any particular theory, it is believed that such polymers may exhibit desirably low dielectric constants, high dielectric breakdown voltage, high resistance to electrical failure (e.g., by flashover, sparkover, breakdown, leakage, and/or short circuit), favorable mechanical properties (e.g., high resistance to damage during mechanical deformation, retention of one or more favorable properties upon bending and/or elongation, flexibility), high water vapor permeability, high optical transparency, high fungal resistance, high resistance to thermal shock, high resistance to corrosion, and/or retention of adhesiveness during mechanical cycling. Some such polymers may also perform well as barriers (e.g., to biological fluids, liquid water, salt, and/or loose metallic debris on circuitry). It is also believed that polymers having a relatively high percentage of cyclic siloxane groups may exhibit fewer defects (e.g., pinholes, cracks, bubbles, whitish spots, blisters, wrinkles, sites of delamination) than polymers formed from the same monomers but having a lower percentage of cyclic siloxane groups.

In some embodiments, a percentage of cyclic siloxane groups in the polymer with respect to all of the siloxane groups in the polymer is greater than or equal to 60%, greater than or equal to 70%, greater than or equal to 80%, greater than or equal to 90%, greater than or equal to 95%, greater than or equal to 97.5%, greater than or equal to 99%, greater than or equal to 99.9%, or greater than or equal to 99.99%. In some embodiments, a percentage of cyclic siloxane groups in the polymer with respect to all of the siloxane groups in the polymer is less than or equal to 100%, less than or equal to 99.99%, less than or equal to 99.9%, less than or equal to 99%, less than or equal to 97.5%, less than or equal to 95%, less than or equal to 90%, less than or equal to 80%, or less than or equal to 70%. Combinations of the above-referenced ranges are also possible (e.g., greater than or equal to 60% and less than or equal to 100%). Other ranges are also possible.

The percentage of cyclic siloxane groups in the polymer with respect to all of the siloxane groups in the polymer may be determined by measuring a thickness-normalized and background-corrected FTIR spectrum and then performing a calculation. The thickness normalization may comprise measuring the thickness of the polymer (e.g., by profilometry) and then dividing the measured FTIR spectrum by the measured thickness of the polymer. Background correction may comprise measuring the FTIR spectrum of the substrate on which the polymer is deposited and subtracting this FTIR spectrum from the measured FITR spectrum of the polymer and substrate together. After performing background correction and then thickness correction, the following equation may be solved:

$$\text{Percent cyclic siloxane groups in polymer} = \frac{\text{maximum absorbance of cyclic siloxane peak}}{(\text{maximum absorbance of cyclic siloxane peak} + \text{maximum absorbance of linear siloxane peak})} \cdot 100\%,$$

in which the maximum absorbance of the cyclic siloxane peak is the maximum absorbance between about 1105 $cm^{-1}$ and about 1120 $cm^{-1}$ in the FTIR measured spectrum and the maximum absorbance of the linear siloxane peak is the maximum absorbance between about 1070 $cm^{-1}$ and about 1105 $cm^{-1}$ in the measured FTIR spectrum.

In some embodiments, a polymer deposited on a substrate has a relatively uniform composition. For instance, a polymer deposited on a substrate may have a percentage of cyclic siloxane groups with respect to all of the siloxane groups in the polymer that varies relatively little across the polymer. In some embodiments, the percentage of cyclic siloxane groups with respect to all of the siloxane groups has a standard deviation of less than or equal to 5%, less than or equal to 4%, less than or equal to 3%, less than or equal to 2%, or less than or equal to 1% across the polymer.

As another example, in some embodiments, a polymer deposited on a substrate may lack any portions that have a percentage of cyclic siloxane groups with respect to all of the siloxane groups in the polymer below a certain amount. For instance, a polymer may lack any portions that have a percentage of cyclic siloxane groups with respect to all of the siloxane groups in the polymer below one or more of the amounts described above with respect to the percentage of cyclic siloxane groups in the polymer with respect to all of the siloxane groups in the polymer.

In some embodiments, a polymer deposited on a substrate has a relatively uniform thickness. In some embodiments, the standard deviation of the polymer thickness is less than or equal to 100%, less than or equal to 75%, less than or equal to 50%, less than or equal to 20%, less than or equal to 10%, less than or equal to 7.5%, less than or equal to 5%, or less than or equal to 2%. In some embodiments, the standard deviation of the polymer thickness is greater than or equal to 1%, greater than or equal to 2%, greater than or equal to 5%, greater than or equal to 7.5%, greater than or equal to 10%, greater than or equal to 20%, greater than or equal to 50%, or greater than or equal to 75%. Combinations of the above-referenced ranges are also possible (e.g., greater than or equal to 1% and less than or equal to 100%). Other ranges are also possible.

The standard deviation of the polymer thickness may be determined by interferometry.

Substrates

The substrates on which the polymers described herein may be deposited may have a variety of suitable properties, which are described in further detail below.

According to some embodiments, a polymer may be formed on at least a portion of a substrate (e.g., a portion of a substrate surface), or on substantially all of a substrate (e.g., substantially all of the substrate surface). Any suitable substrate may be used. In some embodiments, the substrate or at least a portion of the substrate may be conductive and/or semiconductive. The substrate may comprise a single material and/or a plurality of materials. The substrate may comprise one or more electronic components and/or may be functional device. For example, the substrate may be a portion of a functional device, for example, an RF device, an RF circuit, a CMOS substrate and/or chip, a chip, a chip die, a chip package, a board, a circuit board, a printed circuit board, a flexible circuit, an electronic circuit, an electronic chip, a transistor, an ultra-high-speed mixed-signal circuit, a power device, a switch, a clock reference, a frequency-selective filter, a miniaturized array, a digital-to-analog converter, an analog-to-digital converter, a low noise amplifier, a MEMs device, and/or a medical device. In some embodiments, a substrate comprises one or more electrodes (e.g., interdigitated electrodes).

Substrate in an RF Device

In some embodiments, a substrate is positioned in a functional device that is a radio frequency (RF) device. The RF device may be an electronic device that performs radio frequency electronics. In some embodiments, an RF device is used to transmit and/or receive radio signals. Non-limiting examples of RF devices include RF integrated circuits, RFID integrated circuits, RFID tags, and other RF transceivers and transponders. The RF device may or may not include an internal antenna element. In some embodiments, the RF device is a high frequency RF device. Other RF devices include, but are not limited to, MIMCs, transmission lines, filters, and oscillators.

In some embodiments, an RF device is a high-frequency RF device. The high-frequency RF device may operate at a frequency greater than 100 MHz, greater than 250 MHz, greater than 500 MHz, greater than 1 GHz, greater than 2.5 GHz, greater than 5 GHz, greater than 10 GHz, greater than 25 GHz, greater than 50 GHz, or greater than 100 GHz. The high frequency RF device may operate at a frequency of less than 250 GHz, less than 100 GHz, less than 50 GHz, less than 25 GHz, less than 10 GHz, less than 5 GHz, less than 2.5 GHz, less than 1 GHz, less than 500 MHz, or less than 250 MHz. Combinations of the above-referenced ranges are also possible (e.g., greater than 100 MHz and less than 250 GHz). Other ranges are also possible.

As described herein, in certain embodiments, a substrate is positioned on a functional device that comprises one or more semiconductors. In some embodiments, the semiconductor(s) may comprise or form complex circuitry. According to some embodiments, a functional device and/or a substrate may comprise structures which comprise one or more semiconductor materials, for example, heterojunction bipolar transistors, high-electron mobility transistors, amplifiers, and/or amplifier chains. In some embodiments, a functional device and/or a substrate may comprise indium phosphide heterojunction bipolar transistors, amplifiers, and/or amplifier chains. In certain embodiments, a functional device and/or a substrate may comprise gallium nitride high-electron mobility transistors, amplifiers, and/or amplifier chains.

In some embodiments, a functional device and/or a substrate may comprise both silicon and one or more other semiconductor materials. For example, in some certain embodiments, a functional device and/or a substrate may comprise indium phosphide and silicon, such as in an indium phosphide bipolar CMOS integrated circuit. The indium phosphide bipolar CMOS circuit may comprise both indium phosphide heterojunction bipolar transistors and silicon CMOS. According to some embodiments, a functional device and/or a substrate may comprise gallium nitride and silicon. For instance, a functional device and/or a substrate may comprise gallium nitride high-electron-mobility transistors and silicon CMOS. In some embodiments, a functional device and/or a substrate may comprise indium phosphide, gallium nitride, and silicon. In certain embodiments, a functional device and/or a substrate may comprise indium phosphide heterojunction bipolar transistors, gallium nitride high-electron-mobility transistors, and silicon CMOS. Other combinations of semiconductors and compound semiconductors are also possible.

Substrate in a Medical Device

According to certain embodiments, a substrate is positioned in a functional device that is a medical device. In some embodiments, such medical devices are designed to be implanted in the body or disposed on the body. The devices may be electronic medical devices, such as medical devices that comprise digital electronics. In some embodiments, a polymer deposited on a substrate may take the form of one layer of several on the medical device. The layer may be an interstitial layer (e.g., a layer between two other layers), it may be the outermost layer, or it may be the innermost layer. In some embodiments, a polymer deposited on a substrate positioned in a medical device takes the form of an interstitial layer positioned between two low permeability layers.

In embodiments in which a substrate is positioned in a medical device, the medical device may be any suitable medical device, non-limiting examples of which are described below. For instance, the medical device may be a medical device suitable for being implanted into the eye (e.g., a retinal implants, a retinal prosthesis, a smart contact lens); suitable for stimulating nerves (e.g., a phrenic nerve stimulator, a breathing pacemaker system, a diaphragm pacing system); suitable for use as a sensor (e.g., an implantable glucose sensor); suitable for being implanted in and/or used on the ear (e.g., a cochlear implant); suitable for use with the heart (e.g., a pacemakers, a defibrillators); suitable for use with the bladder (e.g., a sacral anterior root stimulator); suitable for pain management (e.g., an occipital nerve stimulator, a spinal cord stimulator); suitable for use in the treatment of Parkinson's disease and/or dystonia (e.g., a deep brain stimulator); suitable for use in the treatment of epilepsy (e.g., a neurostimulator, a vagus nerve stimulator); suitable for stimulating peripheral nerves (e.g., a drop foot stimulator, a handgrip stimulator); suitable for stimulating the lower esophagus; suitable for use in vagal blocking therapy; suitable for use as a component of an implantable drug delivery system (e.g., an implantable pump, an electromagnetic micropump, an osmotic micropump, an electroosmotic micropump, an electrolysis micropump, a constant flow infusion pump, an ophthalmic micropump, a wireless microchip drug delivery system); suitable for use as a wireless endoscopy capsule; and/or suitable for use in the central nervous system (e.g., capable of reading activation potentials in single cells and/or nerve bundles).

In some embodiments, a substrate is positioned in a medical device that is configured to be exposed to a biological environment or a biological fluid via implantation within or on a subject (e.g., a human). For example, the medical device may be configured to be implanted in the ear, eye, heart, liver, kidney, stomach, skin, nervous system, spinal cord, brain, bladder, and/or esophagus a subject. Non-limiting examples of biological fluids to which a medical device and/or substrate may be exposed include saliva, whole blood, plasma, serum, lymph, synovial fluid, peritoneal fluid, pleural fluid, urine, sputum, semen, vaginal lavage, bone marrow, cerebrospinal cord fluid, and tears.

Substrate Includes a Conductive Material

In certain embodiments, a substrate or at least a portion of a substrate comprises a conductive material (e.g., a metal). Non-limiting examples of substantially conductive materials the substrate may comprise includes indium tin oxide (ITO), fluorine tin oxide (FTO), antimony-doped tin oxide (ATO), aluminum-doped zinc oxide (AZO), glassy carbon, carbon mesh, metals, metal alloys, lithium-containing compounds, metal oxides (e.g., platinum oxide, nickel oxide, zinc oxide, tin oxide, vanadium oxide, zinc-tin oxide, indium oxide, indium-zinc oxide), graphite, zeolites, and the like. Non-limiting examples of suitable metals the substrate may comprise (including metals comprised in metal alloys and metal oxides) include gold, copper, silver, platinum, ruthenium, rhodium, osmium, iridium, nickel, cadmium, tin, lithium, chromium, calcium, titanium, aluminum, cobalt, zinc, vanadium, nickel, palladium, or the like, and combinations thereof.

Substrate Includes a Non-Conductive Material

In some embodiments, at least a portion of the substrate comprises a non-conductive material, for example, an inorganic material, (e.g., quartz, glass, etc.) or a polymeric material (e.g., polyethylene terephthalate, polyethylene naphthalate, polycarbonate, polystyrene, polypropylene, etc.).

Substrate Includes a Semiconductor

In some embodiments, a substrate comprises a semiconductor, for example, silicon, germanium, an alloy comprising at least one of silicon and germanium, an alloy comprising silicon and germanium, and/or an antimonide-based compound semiconductor. In certain embodiments, a substrate may comprise one or more of aluminum nitride, silicon carbide, indium phosphide, gallium sulfide, gallium arsenide, and gallium nitride. In some embodiments, the semiconductor may comprise at least one semiconductor cation and at least one semiconductor anion. Non-limiting examples of semiconductor cations include aluminum, silicon, indium and gallium. Non-limiting examples of semiconductor anions include carbide, arsenide, antimonide, phosphide, sulfide, and nitride ions.

Substrate Includes an Alloy

In some embodiments, a substrate comprises an alloy, such as a solder or a solder flux. In some embodiments, a substrate comprises a ceramic. In some embodiments, the ceramic comprises a ceramic cation and a ceramic anion. Non-limiting examples of suitable ceramic cations include aluminum, silicon, indium and gallium. Non-limiting examples of suitable ceramic anions include carbide, arsenide, antimonide, phosphide, sulfide, and nitride ions.

Substrates may be transparent, semi-transparent, semi-opaque, and/or opaque.

Substrates may be solid, semi-porous, and/or porous.

The substrates described herein may be of any size or shape. Non-limiting examples of suitable shapes include sheets, cubes, cylinders, hollow tubes, spheres, and the like. The substrates described herein may be of any suitable size. In some cases, the maximum dimension of a substrate in one dimension may be at least 1 mm, at least 1 cm, at least 5 cm, at least 10 cm, at least 1 m, or at least 2 m. In some cases, the minimum dimension of a substrate in one dimension may be less than 50 cm, less than 10 cm, less than 5 cm, less than 1 cm, less than 10 mm, less than 1 mm, less than 1 micron, less than 100 nm, less than 10 nm, or less than 1 nm. Substrates may or may not be substantially planar. For example, a substrate may comprise ripples, waves, dendrimers, spheres (e.g., nanospheres), rods (e.g., nanorods), a powder, a precipitate, a plurality of particles, and the like.

In certain embodiments, a substrate may undergo one or more preparation steps prior to serving as a substrate on which the polymer will be deposited. Several possible preparation steps are described below. For example, in some embodiments, the substrate may be cleaned by exposing the substrate to a fluid and then soaking the substrate in the fluid, rinsing the substrate with the fluid, and/or sonicating the substrate in the presence of the fluid prior to the reaction in some embodiments. Non-limiting examples of suitable fluids for such processes include organic solvents, water, and/or solutions comprising an organic or aqueous solvent and a surfactant. In some embodiments, the substrate may be exposed to an elevated temperature and/or a reduced pressure in order to remove volatile contaminants. Suitable temperatures include temperatures between 20° C. and 300° C. Suitable pressures include pressures between 0.1 mTorr and 1 atm.

According to certain embodiments, the substrate may undergo a plasma cleaning step prior to the reaction. Other preparation steps are also possible.

In some embodiments, one or more adhesion-promoting linkers may be applied to the substrate. Non-limiting examples of such linkers include silane-containing compounds, organophosphate-containing compounds, and thiol-containing compounds.

In some embodiments, a polymer is deposited on more than one surface of a substrate (e.g., two opposing surfaces, two surfaces that meet at a corner). It also possible for a polymer to be deposited on all of the surfaces of a substrate. This may be facilitated by employing a racking system to suspend the substrate in a deposition chamber as described elsewhere herein.

In some embodiments, a polymer is deposited on two or more substrates during a common deposition process. This may be accomplished by including two or more substrates in a deposition chamber during polymer deposition, such as with the aid of a racking system described elsewhere herein.

Definitions

For convenience, certain terms employed in the specification, examples, and appended claims are listed here.

As used herein, the term "reacting" refers to the forming of a bond between two or more components to produce a stable, isolable compound. For example, a first component and a second component may react to form one reaction product comprising the first component and the second component joined by a covalent bond. That is, the term "reacting" does not refer to the interaction of solvents, catalysts, bases, ligands, or other materials which may serve to promote the occurrence of the reaction with the component(s).

Definitions of specific functional groups and chemical terms are described in more detail below. For purposes of this invention, the chemical elements are identified in accordance with the Periodic Table of the Elements, CAS version, *Handbook of Chemistry and Physics,* $75^{th}$ Ed., inside cover, and specific functional groups are generally defined as described therein. Additionally, general principles of organic chemistry, as well as specific functional moieties and reactivity, are described in *Organic Chemistry, Thomas Sorrell, University Science Books, Sausalito:* 1999, the entire contents of which are incorporated herein by reference.

The term "aliphatic," as used herein, includes both saturated and unsaturated, nonaromatic, straight chain (i.e., unbranched), branched, acyclic, and cyclic (i.e., carbocyclic) hydrocarbons, which are optionally substituted with one or more functional groups. As will be appreciated by one of ordinary skill in the art, "aliphatic" is intended herein to include, but is not limited to, alkyl, alkenyl, alkynyl, cycloalkyl, cycloalkenyl, and cycloalkynyl moieties. Thus, as used herein, the term "alkyl" includes straight, branched and cyclic alkyl groups. An analogous convention applies to other generic terms such as "alkenyl", "alkynyl", and the like. Furthermore, as used herein, the terms "alkyl", "alkenyl", "alkynyl", and the like encompass both substituted and unsubstituted groups. In certain embodiments, as used herein, "aliphatic" is used to indicate those aliphatic groups (cyclic, acyclic, substituted, unsubstituted, branched or unbranched) having 1-20 carbon atoms. Aliphatic group substituents include, but are not limited to, any of the substituents described herein, that result in the formation of a stable moiety (e.g., aliphatic, alkyl, alkenyl, alkynyl, heteroaliphatic, heterocyclic, aryl, heteroaryl, acyl, oxo, imino, thiooxo, cyano, isocyano, amino, azido, nitro, hydroxyl, thiol, halo, aliphaticamino, heteroaliphaticamino, alkylamino, heteroalkylamino, arylamino, heteroarylamino, alkylaryl, arylalkyl, aliphaticoxy, heteroaliphaticoxy, alkyloxy, heteroalkyloxy, aryloxy, heteroaryloxy, aliphaticthioxy, heteroaliphaticthioxy, alkylthioxy, heteroalkylthioxy, arylthioxy, heteroarylthioxy, acyloxy, and the like, each of which may or may not be further substituted).

As used herein, the term "alkyl" is given its ordinary meaning in the art and refers to the radical of saturated aliphatic groups, including straight-chain alkyl groups, branched-chain alkyl groups, cycloalkyl (alicyclic) groups, alkyl substituted cycloalkyl groups, and cycloalkyl substituted alkyl groups. In some cases, the alkyl group may be a lower alkyl group, i.e., an alkyl group having 1 to 10 carbon atoms (e.g., methyl, ethyl, propyl, butyl, pentyl, hexyl, heptyl, octyl, nonyl, or decyl). In some embodiments, a straight chain or branched chain alkyl may have 30 or fewer carbon atoms in its backbone, and, in some cases, 20 or fewer. In some embodiments, a straight chain or branched chain alkyl may have 12 or fewer carbon atoms in its backbone (e.g., $C_1$-$C_{12}$ for straight chain, $C_3$-$C_{12}$ for branched chain), 6 or fewer, or 4 or fewer. Likewise, cycloalkyls may have from 3-10 carbon atoms in their ring structure, or 5, 6 or 7 carbons in the ring structure. Examples of alkyl groups include, but are not limited to, methyl, ethyl, propyl, isopropyl, cyclopropyl, butyl, isobutyl, t-butyl, cyclobutyl, hexyl, and cyclochexyl.

The term "alkylene" as used herein refers to a bivalent alkyl group. An "alkylene" group is a polymethylene group, i.e., $-(CH_2)_z-$, wherein z is a positive integer, e.g., from 1 to 20, from 1 to 10, from 1 to 6, from 1 to 4, from 1 to 3, from 1 to 2, or from 2 to 3. A substituted alkylene chain is a polymethylene group in which one or more methylene hydrogen atoms are replaced with a substituent. Suitable substituents include those described herein for a substituted aliphatic group.

Generally, the suffix "-ene" is used to describe a bivalent group. Thus, any of the terms defined herein can be modified with the suffix "-ene" to describe a bivalent version of that moiety. For example, a bivalent carbocycle is "carbocyclylene", a bivalent aryl ring is "arylene", a bivalent benzene ring is "phenylene", a bivalent heterocycle is "heterocyclylene", a bivalent heteroaryl ring is "heteroarylene", a bivalent alkyl chain is "alkylene", a bivalent alkenyl chain is "alkenylene", a bivalent alkynyl chain is "alkynylene", a bivalent heteroalkyl chain is "heteroalkylene", a bivalent heteroalkenyl chain is "heteroalkenylene", a bivalent heteroalkynyl chain is "heteroalkynylene", and so forth.

The terms "alkenyl" and "alkynyl" are given their ordinary meaning in the art and refer to unsaturated aliphatic groups analogous in length and possible substitution to the alkyls described above, but that contain at least one double or triple bond respectively.

In certain embodiments, the alkyl, alkenyl and alkynyl groups employed in the invention contain 1-20 aliphatic carbon atoms. In certain other embodiments, the alkyl, alkenyl, and alkynyl groups employed in the invention contain 1-10 aliphatic carbon atoms. In yet other embodiments, the alkyl, alkenyl, and alkynyl groups employed in the invention contain 1-8 aliphatic carbon atoms. In still other embodiments, the alkyl, alkenyl, and alkynyl groups employed in the invention contain 1-6 aliphatic carbon atoms. In yet other embodiments, the alkyl, alkenyl, and alkynyl groups employed in the invention contain 1-4 carbon atoms. Illustrative aliphatic groups thus include, but are not limited to, for example, methyl, ethyl, n-propyl, isopropyl, allyl, n-butyl, sec-butyl, isobutyl, t-butyl, n-pentyl, sec-pentyl, isopentyl, t-pentyl, n-hexyl, sec-hexyl, moieties and the like, which again, may bear one or more substituents. Alkenyl groups include, but are not limited to, for example, ethenyl, propenyl, butenyl, 1-methyl-2-buten-1-yl, and the like. Representative alkynyl groups include, but are not limited to, ethynyl, 2-propynyl (propargy1), 1-propynyl and the like.

The term "cycloalkyl," as used herein, refers specifically to groups having three to ten, preferably three to seven carbon atoms. Suitable cycloalkyls include, but are not limited to cyclopropyl, cyclobutyl, cyclopentyl, cyclohexyl, cycloheptyl and the like, which, as in the case of other aliphatic, heteroaliphatic, or hetercyclic moieties, may optionally be substituted with substituents including, but not limited to aliphatic; heteroaliphatic; aryl; heteroaryl; arylalkyl; heteroarylalkyl; alkoxy; aryloxy; heteroalkoxy; heteroaryloxy; alkylthio; arylthio; heteroalkylthio; heteroarylthio; —F; —Cl; —Br; —I; —OH; $-NO_2$; —CN; $-CF_3$; $-CH_2CF_3$; $-CHCl_2$; $-CH_2OH$; $-CH_2CH_2OH$; $-CH_2NH_2$; $-CH_2SO_2CH_3$; $-C(O)R_x$; $-CO_2(R_x)$;

—$CON(R_x)_2$; —$OC(O)R_x$; —$OCO_2R_x$; —$OCON(R_x)_2$; —$N(R_x)_2$; —$S(O)_2R_x$; —$NR_x(CO)R_x$, wherein each occurrence of $R_x$ independently includes, but is not limited to, aliphatic, heteroaliphatic, aryl, heteroaryl, arylalkyl, or heteroarylkyl, wherein any of the aliphatic, heteroaliphatic, arylalkyl, or heteroarylalkyl substituents described above and herein may be substituted or unsubstituted, branched or unbranched, cyclic or acyclic, and wherein any of the aryl or heteroaryl substituents described above and herein may be substituted or unsubstituted. Additional examples of generally applicable substituents are illustrated by the specific embodiments shown in the Examples that are described herein.

The term "heteroaliphatic," as used herein, refers to an aliphatic moiety, as defined herein, which includes both saturated and unsaturated, nonaromatic, straight chain (i.e., unbranched), branched, acyclic, cyclic (i.e., heterocyclic), or polycyclic hydrocarbons, which are optionally substituted with one or more functional groups, and that contain one or more oxygen, sulfur, nitrogen, phosphorus, or silicon atoms, e.g., in place of carbon atoms. In certain embodiments, heteroaliphatic moieties are substituted by independent replacement of one or more of the hydrogen atoms thereon with one or more substituents. As will be appreciated by one of ordinary skill in the art, "heteroaliphatic" is intended herein to include, but is not limited to, heteroalkyl, heteroalkenyl, heteroalkynyl, heterocycloalkyl, heterocycloalkenyl, and heterocycloalkynyl moieties. Thus, the term "heteroaliphatic" includes the terms "heteroalkyl," "heteroalkenyl", "heteroalkynyl", and the like. Furthermore, as used herein, the terms "heteroalkyl", "heteroalkenyl", "heteroalkynyl", and the like encompass both substituted and unsubstituted groups. In certain embodiments, as used herein, "heteroaliphatic" is used to indicate those heteroaliphatic groups (cyclic, acyclic, substituted, unsubstituted, branched or unbranched) having 1-20 carbon atoms. Heteroaliphatic group substituents include, but are not limited to, any of the substituents described herein, that result in the formation of a stable moiety (e.g., aliphatic, alkyl, alkenyl, alkynyl, heteroaliphatic, heterocyclic, aryl, heteroaryl, acyl, sulfinyl, sulfonyl, oxo, imino, thiooxo, cyano, isocyano, amino, azido, nitro, hydroxyl, thiol, halo, aliphaticamino, heteroaliphaticamino, alkylamino, heteroalkylamino, arylamino, heteroarylamino, alkylaryl, arylalkyl, aliphaticoxy, heteroaliphaticoxy, alkyloxy, heteroalkyloxy, aryloxy, heteroaryloxy, aliphaticthioxy, heteroaliphaticthioxy, alkylthioxy, heteroalkylthioxy, arylthioxy, heteroarylthioxy, acyloxy, and the like, each of which may or may not be further substituted).

The term "heteroalkyl" is given its ordinary meaning in the art and refers to an alkyl group as described herein in which one or more carbon atoms is replaced by a heteroatom. Suitable heteroatoms include oxygen, sulfur, nitrogen, phosphorus, and the like. Examples of heteroalkyl groups include, but are not limited to, alkoxy, alkoxyalkyl, amino, thioester, poly(ethylene glycol), and alkyl-substituted amino.

The terms "heteroalkenyl" and "heteroalkynyl" are given their ordinary meaning in the art and refer to unsaturated aliphatic groups analogous in length and possible substitution to the heteroalkyls described above, but that contain at least one double or triple bond respectively.

Some examples of substituents of the above-described aliphatic (and other) moieties of compounds of the invention include, but are not limited to aliphatic; heteroaliphatic; aryl; heteroaryl; alkylaryl; alkylheteroaryl; alkoxy; aryloxy; heteroalkoxy; heteroaryloxy; alkylthio; arylthio; heteroalkylthio; heteroarylthio; F; Cl; Br; I; —OH; —$NO_2$; —CN; —$CF_3$; —$CHF_2$; —$CH_2F$; —$CH_2CF_3$; —$CHCl_2$; —$CH_2OH$; —$CH_2CH_2OH$; —$CH_2NH_2$; —$CH_2SO_2CH_3$; —$C(O)R_x$; —$CO_2(R_x)$; —$CON(R_x)_2$; —$OC(O)R_x$; —$OCO_2R_x$; —$OCON(R_x)_2$; —$N(R_x)_2$; —$S(O)_2R_x$; —$NR_x(CO)R_x$ wherein each occurrence of $R_x$ independently includes, but is not limited to, aliphatic, alycyclic, heteroaliphatic, heterocyclic, aryl, heteroaryl, alkylaryl, or alkylheteroaryl, wherein any of the aliphatic, heteroaliphatic, alkylaryl, or alkylheteroaryl substituents described above and herein may be substituted or unsubstituted, branched or unbranched, cyclic or acyclic, and wherein any of the aryl or heteroaryl substituents described above and herein may be substituted or unsubstituted. Additional examples of generally applicable substituents are illustrated by the specific embodiments shown in the Examples that are described herein.

The term "aryl" is given its ordinary meaning in the art and refers to aromatic carbocyclic groups, optionally substituted, having a single ring (e.g., phenyl), multiple rings (e.g., biphenyl), or multiple fused rings in which at least one is aromatic (e.g., 1,2,3,4-tetrahydronaphthyl, naphthyl, anthryl, or phenanthryl). That is, at least one ring may have a conjugated pi electron system, while other, adjoining rings can be cycloalkyls, cycloalkenyls, cycloalkynyls, aryls and/or heterocyclyls. The aryl group may be optionally substituted, as described herein. Substituents include, but are not limited to, any of the previously mentioned substituents, i.e., the substituents recited for aliphatic moieties, or for other moieties as disclosed herein, resulting in the formation of a stable compound. In some cases, an aryl group is a stable mono- or polycyclic unsaturated moiety having preferably 3-14 carbon atoms, each of which may be substituted or unsubstituted. "Carbocyclic aryl groups" refer to aryl groups wherein the ring atoms on the aromatic ring are carbon atoms. Carbocyclic aryl groups include monocyclic carbocyclic aryl groups and polycyclic or fused compounds (e.g., two or more adjacent ring atoms are common to two adjoining rings) such as naphthyl groups.

The terms "heteroaryl" is given its ordinary meaning in the art and refers to aryl groups comprising at least one heteroatom as a ring atom. A "heteroaryl" is a stable heterocyclic or polyheterocyclic unsaturated moiety having preferably 3-14 carbon atoms, each of which may be substituted or unsubstituted. Substituents include, but are not limited to, any of the previously mentioned substituents, i.e., the substitutes recited for aliphatic moieties, or for other moieties as disclosed herein, resulting in the formation of a stable compound. In some cases, a heteroaryl is a cyclic aromatic radical having from five to ten ring atoms of which one ring atom is selected from S, O, and N; zero, one, or two ring atoms are additional heteroatoms independently selected from S, O, and N; and the remaining ring atoms are carbon, the radical being joined to the rest of the molecule via any of the ring atoms, such as, for example, pyridyl, pyrazinyl, pyrimidinyl, pyrrolyl, pyrazolyl, imidazolyl, thiazolyl, oxazolyl, isooxazolyl, thiadiazolyl, oxadiazolyl, thiophenyl, furanyl, quinolinyl, isoquinolinyl, and the like.

It will also be appreciated that aryl and heteroaryl moieties, as defined herein may be attached via an alkyl or heteroalkyl moiety and thus also include -(alkyl)aryl, -(heteroalkyl)aryl, -(heteroalkyl)heteroaryl, and -(heteroalkyl)heteroaryl moieties. Thus, as used herein, the phrases "aryl or heteroaryl moieties" and "aryl, heteroaryl, -(alkyl)aryl, -(heteroalkyl)aryl, -(heteroalkyl)heteroaryl, and -(heteroalkyl)heteroaryl" are interchangeable. Substituents include, but are not limited to, any of the previously mentioned substituents, i.e., the substituents recited for aliphatic moieties, or for other moieties as disclosed herein, resulting in the formation of a stable compound.

It will be appreciated that aryl and heteroaryl groups (including bicyclic aryl groups) can be unsubstituted or substituted, wherein substitution includes replacement of one or more of the hydrogen atoms thereon independently with any one or more of the following moieties including, but not limited to: aliphatic; alicyclic; heteroaliphatic; heterocyclic; aromatic; heteroaromatic; aryl; heteroaryl; alkylaryl; heteroalkylaryl; alkylheteroaryl; heteroalkylheteroaryl; alkoxy; aryloxy; heteroalkoxy; heteroaryloxy; alkylthio; arylthio; heteroalkylthio; heteroarylthio; F; Cl; Br; I; —OH; $—NO_2$; —CN; $—CF_3$; $—CH_2F$; $—CHF_2$; $—CH_2CF_3$; $—CHCl_2$; $—CH_2OH$; $—CH_2CH_2OH$; $—CH_2NH_2$; $—CH_2SO_2CH_3$; $—C(O)R_x$; $—CO_2(R_x)$; $—CON(R_x)_2$; $—OC(O)R_x$; $—OCO_2R_x$; $—OCON(R_x)_2$; $—N(R_x)_2$; $—S(O)R_x$; $—S(O)_2R_x$; $—NR_x(CO)R_x$ wherein each occurrence of $R_x$ independently includes, but is not limited to, aliphatic, alicyclic, heteroaliphatic, heterocyclic, aromatic, heteroaromatic, aryl, heteroaryl, alkylaryl, alkylheteroaryl, heteroalkylaryl or heteroalkylheteroaryl, wherein any of the aliphatic, alicyclic, heteroaliphatic, heterocyclic, alkylaryl, or alkylheteroaryl substituents described above and herein may be substituted or unsubstituted, branched or unbranched, saturated or unsaturated, and wherein any of the aromatic, heteroaromatic, aryl, heteroaryl, -(alkyl)aryl or -(alkyl)heteroaryl substituents described above and herein may be substituted or unsubstituted. Additionally, it will be appreciated, that any two adjacent groups taken together may represent a 4, 5, 6, or 7-membered substituted or unsubstituted alicyclic or heterocyclic moiety. Additional examples of generally applicable substituents are illustrated by the specific embodiments described herein.

The terms "halo" and "halogen" as used herein refer to an atom selected from the group consisting of fluorine, chlorine, bromine, and iodine.

It will be appreciated that the above groups and/or compounds, as described herein, may be optionally substituted with any number of substituents or functional moieties. That is, any of the above groups may be optionally substituted. As used herein, the term "substituted" is contemplated to include all permissible substituents of organic compounds, "permissible" being in the context of the chemical rules of valence known to those of ordinary skill in the art. In general, the term "substituted" whether preceded by the term "optionally" or not, and substituents contained in formulas of this invention, refer to the replacement of hydrogen radicals in a given structure with the radical of a specified substituent. When more than one position in any given structure may be substituted with more than one substituent selected from a specified group, the substituent may be either the same or different at every position. It will be understood that "substituted" also includes that the substitution results in a stable compound, e.g., which does not spontaneously undergo transformation such as by rearrangement, cyclization, elimination, etc. In some cases, "substituted" may generally refer to replacement of a hydrogen with a substituent as described herein. However, "substituted," as used herein, does not encompass replacement and/or alteration of a key functional group by which a molecule is identified, e.g., such that the "substituted" functional group becomes, through substitution, a different functional group. For example, a "substituted phenyl group" must still comprise the phenyl moiety and cannot be modified by substitution, in this definition, to become, e.g., a pyridine ring. In a broad aspect, the permissible substituents include acyclic and cyclic, branched and unbranched, carbocyclic and heterocyclic, aromatic and nonaromatic substituents of organic compounds. Illustrative substituents include, for example, those described herein. The permissible substituents can be one or more and the same or different for appropriate organic compounds. For purposes of this invention, the heteroatoms such as nitrogen may have hydrogen substituents and/or any permissible substituents of organic compounds described herein which satisfy the valencies of the heteroatoms. Furthermore, this invention is not intended to be limited in any manner by the permissible substituents of organic compounds. The term "stable," as used herein, preferably refers to compounds which possess stability sufficient to allow manufacture and which maintain the integrity of the compound for a sufficient period of time to be detected and preferably for a sufficient period of time to be useful for the purposes detailed herein.

Examples of substituents include, but are not limited to, halogen, azide, alkyl, aralkyl, alkenyl, alkynyl, cycloalkyl, hydroxyl, alkoxyl, amino, nitro, sulfhydryl, imino, amido, phosphonate, phosphinate, carbonyl, carboxyl, silyl, ether, alkylthio, sulfonyl, sulfonamido, ketone, aldehyde, ester, heterocyclyl, aromatic or heteroaromatic moieties, $—CF_3$, —CN, aryl, aryloxy, perhaloalkoxy, aralkoxy, heteroaryl, heteroaryloxy, heteroarylalkyl, heteroaralkoxy, azido, amino, halide, alkylthio, oxo, acylalkyl, carboxy esters, -carboxamido, acyloxy, aminoalkyl, alkylaminoaryl, alkylaryl, alkylaminoalkyl, alkoxyaryl, arylamino, aralkylamino, alkylsulfonyl, -carboxamidoalkylaryl, -carboxamidoaryl, hydroxyalkyl, haloalkyl, alkylaminoalkylcarboxy-, aminocarboxamidoalkyl-, cyano, alkoxyalkyl, perhaloalkyl, arylalkyloxyalkyl, and the like.

The subject-matter disclosed herein may also be understood in view of the numbered paragraphs, as provided below:

Paragraph 1. A plasma-enhanced chemical vapor deposition (PECVD) reactor, comprising:

a deposition chamber; and a control system, wherein:

the control system is configured to control one or more of a composition of a precursor gas, a flow rate of a precursor gas, a pressure inside the deposition chamber, and/or a power supplied by a plasma electrode, and the control system is configured to maintain a total energy to which a monomer flowing through the deposition chamber is exposed at a value that is greater than or equal to $1.5\times10^{-24}$ J/molecule and less than or equal to $32.0\times10^{-24}$ J/molecule.

Paragraph 2. The PECVD reactor of paragraph 1, wherein the deposition chamber is enclosed by a plurality of walls; and the plasma electrode is positioned inside the deposition chamber, and optionally wherein a ratio of a spacing between the plasma electrode and a sidewall to which it is closest to a spacing between the plasma electrode and the bottom wall is sufficient to allow the flow of the precursor gas to be laminar or substantially laminar.

Paragraph 3. The PECVD reactor of any one of paragraphs 1-2, wherein the ratio of a spacing between the plasma electrode and a sidewall to which it is closest to a spacing between the plasma electrode and the bottom wall is greater than or equal to 0.1 and less than or equal to 0.4, greater than or equal to 0.1 and less than or equal to 0.3, greater than or equal to 0.15 and less than or equal to 0.4, greater than or equal to 0.12 and less than or equal to 0.4, greater than or equal to 0.12 and less than or equal to 0.3, or greater than or equal to 0.12 and less than or equal to 0.2.

Paragraph 4. The PECVD reactor of any one of paragraphs 1-3, wherein when a precursor gas flows in proximity to a substrate within the deposition chamber and wherein the precursor gas comprises an initiator and at least one monomer comprising a cyclic siloxane and at least two vinyl groups, a polymer formed from the at least one monomer is deposited on at least a portion of the substrate, wherein a percentage of cyclic siloxane groups in the polymer is greater than or equal to 60%.

Paragraph 5. The PECVD reactor of any one of paragraphs 1-4, wherein the deposition chamber comprises an inlet.

Paragraph 6. The PECVD reactor of any one of paragraphs 1-5, wherein the inlet takes the form of a showerhead through which the precursor gas is introduced into the deposition chamber.

Paragraph 7. The PECVD reactor of any one of paragraphs 1-6, wherein the inlet is a ground electrode.

Paragraph 8. The PECVD reactor of paragraph 6 or paragraph 7, wherein the showerhead comprises a plurality of apertures through which the precursor gas is introduced into the deposition chamber, and wherein the apertures are positioned around an aperture-free region.

Paragraph 9. The PECVD reactor of any one of paragraphs 5-8, wherein the PECVD reactor further comprises a premixing zone positioned upstream from the inlet, and wherein the premixing zone is configured such that two or more sources of gas are capable of mixing to form the precursor gas.

Paragraph 10. The PECVD reactor of paragraph 9, wherein a ratio of the volume of the premixing zone to a volume of the deposition chamber is greater than or equal to 0.06 and less than or equal to 0.15.

Paragraph 11. The PECVD reactor of any one of paragraphs 1-10, further comprising a plasma electrode positioned inside the deposition chamber.

Paragraph 12. The PECVD reactor of paragraph 11, wherein the plasma electrode is configured to supply plasma at a power of less than or equal to 50 W.

Paragraph 13. The PECVD reactor of any one of paragraphs 11-12, wherein the plasma electrode is configured to supply plasma at a power density of greater than or equal to 0.01 $mW/in^3$ and less than or equal to 0.6 $mW/in^3$.

Paragraph 14. The PECVD reactor of any one of paragraphs 11-13, wherein a spacing between the bottom wall and the plasma electrode is greater than or equal to 2 inches and less than or equal to 5 inches.

Paragraph 15. The PECVD reactor of any one of paragraphs 11-14, wherein the plasma electrode has a cross-sectional area that occupies greater than or equal to 80% of the cross-sectional area of the deposition chamber.

Paragraph 16. The PECVD reactor of any one of paragraphs 1-15, further comprising a racking system.

Paragraph 17. The PECVD reactor of any one of paragraphs 1-16, wherein the deposition chamber has an internal volume of greater than or equal to 3000 $in^3$ and less than or equal to 70000 $in^3$.

Paragraph 18. The PECVD reactor of any one of paragraphs 1 to 17, further comprising an outlet positioned in the bottom wall.

Paragraph 19. The PECVD reactor of paragraph 18, wherein the outlet takes the form of an exhaust port.

Paragraph 20. A method of fabricating a polymer via a plasma-enhanced chemical vapor deposition (PECVD) process, comprising:

flowing a precursor gas in proximity to a substrate within a deposition chamber positioned in a PECVD reactor, wherein the precursor gas comprises an initiator and at least one monomer comprising a cyclic siloxane and at least two vinyl groups, and wherein the total energy to which the monomer is exposed while flowing within the deposition chamber is greater than or equal to $1.5\times10^{-24}$ J/molecule and less than or equal to $32.0\times10^{-24}$ J/molecule; and depositing a polymer formed from the at least one monomer on at least a portion of the substrate.

Paragraph 21. The method of paragraph 20, wherein the deposition chamber is enclosed by a plurality of walls, wherein a plasma electrode is positioned inside the deposition chamber, and optionally wherein a ratio of a spacing between the plasma electrode and a sidewall to which it is closest to a spacing between the plasma electrode and the bottom wall is greater than or equal to 0.1 and less than or equal to 0.4, greater than or equal to 0.1 and less than or equal to 0.3, greater than or equal to 0.15 and less than or equal to 0.4, greater than or equal to 0.12 and less than or equal to 0.4, greater than or equal to 0.12 and less than or equal to 0.3, or greater than or equal to 0.12 and less than or equal to 0.2.

Paragraph 22. The method of any one of paragraphs 20-21, wherein a percentage of cyclic siloxane groups in the polymer is greater than or equal to 60%.

Paragraph 23. The method of any one of paragraphs 20-22, wherein the polymer is deposited at a rate of greater than or equal to 0.01 nm/min and less than or equal to 100 nm/min.

Paragraph 24. The method of any one of paragraphs 20-23, wherein the flow of the precursor gas is laminar or substantially laminar.

Paragraph 25. The method of any one of paragraphs 20-24, wherein the deposition chamber comprises an inlet.

Paragraph 26. The method of any one of paragraphs 20-25, wherein the inlet takes the form of a showerhead through which the precursor gas is introduced into the deposition chamber.

Paragraph 27. The method of any one of paragraphs 20-26, wherein the inlet is a ground electrode.

Paragraph 28. The method of paragraph 26 or 27, wherein the showerhead comprises a plurality of apertures through which the precursor gas is introduced into the deposition chamber, and wherein the apertures are positioned around an aperture-free region.

Paragraph 29. The method of any one of paragraphs 25-28, wherein the PECVD reactor further comprises a premixing zone positioned upstream from the inlet, and wherein the premixing zone is configured such that two or more sources of gas are capable of mixing to form the precursor gas.

Paragraph 30. The method of paragraph 29, wherein a ratio of the volume of the premixing zone to a volume of the deposition chamber is greater than or equal to 0.06 and less than or equal to 0.15.

Paragraph 31. The method of any one of paragraphs 20-30, wherein a flow rate of the precursor gas is greater than or equal to 0.01 sccm and less than or equal to 50 sccm.

Paragraph 32. The method of any one of paragraphs 20-31, wherein a pressure in the deposition chamber is less than or equal to 50 mTorr.

Paragraph 33. The method of any one of paragraphs 20-32, wherein the plasma electrode is configured to supply plasma at a power of less than or equal to 50 W.

Paragraph 34. The method of any one of paragraphs 20-33, wherein the plasma electrode is configured to supply plasma at a power density of greater than or equal to 0.01 $mW/cm^3$ and less than or equal to 0.7 $mW/cm^3$.

Paragraph 35. The method of any one of paragraphs 20-34, wherein less than or equal to 1% of the volume interior to the deposition chamber has a plasma intensity that is greater than or equal to 1% different from the average plasma intensity in the deposition chamber.

Paragraph 36. The method of any one of paragraphs 20-34, wherein less than or equal to 10% of the volume interior to the deposition chamber has a plasma intensity that is greater than or equal to 25% different from the average plasma intensity in the deposition chamber.

Paragraph 37. The method of any one of paragraphs 20-36, wherein a spacing between the bottom wall and the plasma electrode is greater than or equal to 2 inches and less than or equal to 5 inches.

Paragraph 38. The method of any one of paragraphs 20-37, wherein the plasma electrode has a cross-sectional area that occupies greater than or equal to 80% of the cross-sectional area of the deposition chamber.

Paragraph 39. The method of any one of paragraphs 20-38, wherein the PECVD reactor further comprises a racking system.

Paragraph 40. The method of any one of paragraphs 20-39, wherein the deposition chamber has an internal volume of greater than or equal to 3000 $in^3$ and less than or equal to 70000 $in^3$.

Paragraph 41. The method of any one of paragraphs 20-40, wherein the precursor gas has a residence time in the deposition chamber of greater than or equal to 1 second and less than or equal to 60 seconds.

Paragraph 42. The method of any one of paragraphs 20-41, wherein the PECVD reactor further comprises an outlet positioned in the bottom wall.

Paragraph 43. The method of paragraph 42, wherein the outlet takes the form of an exhaust port.

Paragraph 44. The method of any one of paragraphs 20-43, wherein the flow out of the outlet is laminar or substantially laminar.

Paragraph 45. A method of fabricating a polymer via a plasma-enhanced chemical vapor deposition (PECVD) process, comprising:

- flowing a precursor gas in proximity to a substrate within a deposition chamber positioned in the PECVD reactor of any one of paragraphs 1 to 19, wherein the precursor gas comprises an initiator and at least one monomer comprising a cyclic siloxane and at least two vinyl groups, and wherein the total energy to which the monomer is exposed while flowing within the deposition chamber is greater than or equal to $1.5\times10^{-24}$ J/molecule and less than or equal to $32.0\times10^{-24}$ J/molecule; and
- depositing a polymer formed from the at least one monomer on at least a portion of the substrate.

Paragraph 46. The method of paragraph 45, wherein a percentage of cyclic siloxane groups in the polymer is greater than or equal to 60%.

Paragraph 47. The method of any one of paragraphs 45-46, wherein the polymer is deposited at a rate of greater than or equal to 0.01 nm/min and less than or equal to 100 nm/min.

Paragraph 48. The method of any one of paragraphs 45-47, wherein the flow of the precursor gas in the PECVD reactor is laminar or substantially laminar.

Paragraph 49. The method of any one of paragraphs 45-48, wherein a flow rate of the precursor gas is greater than or equal to 0.01 sccm and less than or equal to 50 sccm.

Paragraph 50. The method of any one of paragraphs 45-49, wherein a pressure in the deposition chamber is less than or equal to 50 mTorr.

Paragraph 51. The method of any one of paragraphs 45-50, wherein the plasma electrode is configured to supply plasma at a power of less than or equal to 50 W.

Paragraph 52. The method of any one of paragraphs 45-51, wherein the plasma electrode is configured to supply plasma at a power density of greater than or equal to 0.7 $mW/in^3$ and less than or equal to 22 $mW/in^3$.

Paragraph 53. The method of any one of paragraphs 45-52, wherein less than or equal to 1% of the volume interior to the deposition chamber has a plasma intensity that is greater than or equal to 1% different from the average plasma intensity in the deposition chamber.

Paragraph 54. The method of any one of paragraphs 45-52, wherein less than or equal to 10% of the volume interior to the deposition chamber has a plasma intensity that is greater than or equal to 25% different from the average plasma intensity in the deposition chamber.

Paragraph 55. The method of any one of paragraphs 45-54, wherein the precursor gas has a residence time in the deposition chamber of greater than or equal to 1 second and less than or equal to 60 seconds.

Paragraph 56. The method of any one of paragraphs 45-55, wherein the reactor further comprises an outlet and wherein the flow out of the outlet is substantially laminar.

Example 1

This Example describes the deposition of a polymer comprising cyclic siloxane groups in a deposition chamber positioned in a PECVD reactor.

The deposition chamber had a width and height of 61 cm each and a total volume of 0.2265 $m^3$. The deposition chamber included a plasma electrode and a ground electrode, which were spaced at a distance of 52.3 cm. The plasma electrode and the ground electrode each had a length of 56.9 cm and an area of 3,232 $cm^2$.

The substrate was a silicon wafer having an area of 7 $cm^2$. It was suspended within the deposition chamber at a spacing from the ground electrode of between 10 cm and 40 cm. A schematic of the positioning of the substrate 1632 in the deposition chamber 1600 is shown in FIG. 16. The substrate 1632 is located between the ground electrode 1616 and the plasma electrode 1608. In this example, the ground electrode 1616 was in the form of a showerhead, and the substrate was positioned so that it was substantially aligned with the center of the ground electrode.

A precursor gas comprising an initiator (tert-butyl peroxide), a monomer (trivinyltrimethylcyclotrisiloxane), and a carrier gas (argon) was introduced into the deposition chamber via an inlet taking the form of a showerhead. The monomer and initiator were used as purchased and without further purification. The selected monomer was heated to 70° C. and provided to a manifold at a flow rate of about 1.8 sccm. The initiator was kept at room temperature and provided to the manifold at a flow rate of about 1 sccm. The carrier gas was kept at room temperature and provided to the manifold at a rate of 7.5 sccm. The manifold supplied the monomer, initiator, and carrier gas to a premixing zone which supplied an inlet taking the form of the showerhead.

After leaving the showerhead, the precursor gas was distributed relatively uniformly across the entire width of the substrate.

During flow of the precursor gas through the deposition chamber, the plasma occupied the region between the plasma electrode and the ground electrode. The plasma power source was held constant at the desired power of between 6 W and 600 W. The polymer was deposited to form films having an average thickness of about 500 nm as determined by profilometry.

The surfaces of the polymers were examined by optical microscopy to identify the presence of defects such as delamination, pinholes or cracks. Chemical characterization of the polymers was performed by Fourier transform infrared (FTIR) spectroscopy. The spectrum of a bare substrate was used as the background and subtracted from the FTIR spectra. The FTIR spectra then underwent thickness normalization by the process described elsewhere herein.

Figure 17A:
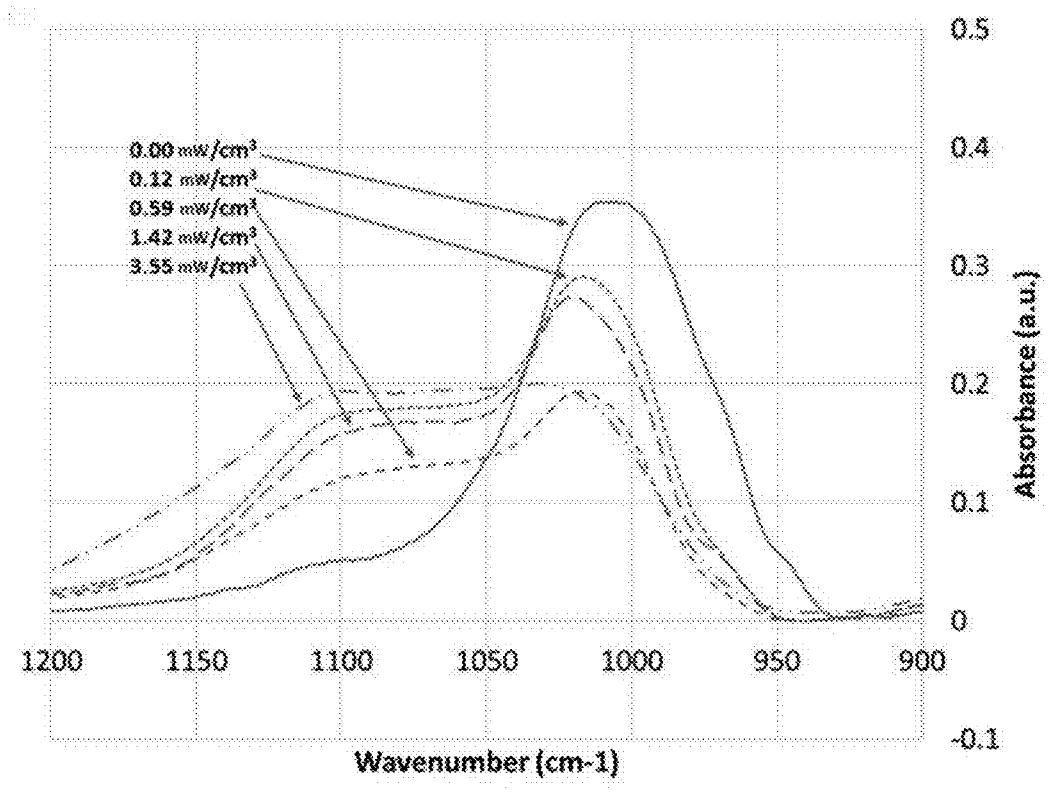
FIG. 17A shows exemplary background-subtracted and thickness-normalized FTIR spectra from various polymers, in accordance with some embodiments.

FIG. 17A shows exemplary background-subtracted and thickness-normalized FTIR spectra from a polymer deposited via iCVD (in a different deposition chamber) and five polymers deposited according to the procedure described above at five different plasma powers: 6 W, 20 W, 100 W, 240 W, and 600 W. The percent of cyclic siloxane groups for each of the five polymers deposited in the presence of a plasma was determined in the manner described elsewhere herein.

Figure 17B:
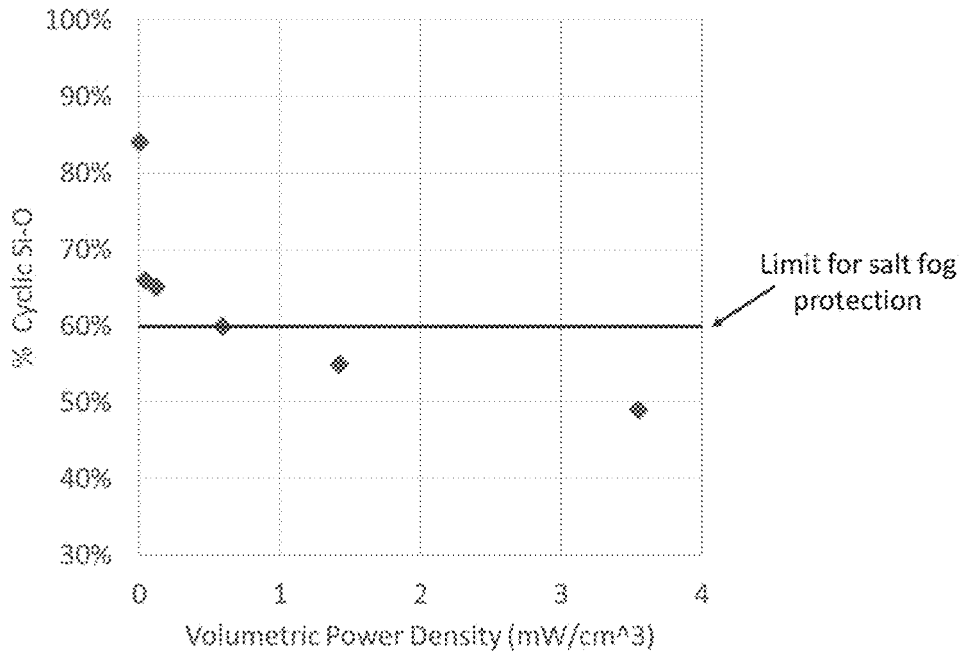
FIG. 17B shows the ratio of the maximum linear siloxane absorption peak to the maximum cyclic siloxane absorption peak for various polymers and also shows which polymers pass the salt fog test described in Method 509.5 5 in MIL-STD-810G (2008), in accordance with some embodiments.

Table 1 shows the ratio of the maximum linear siloxane absorption peak to the maximum cyclic siloxane absorption peak for each of these six polymers. FIG. 17B also shows the ratio of the maximum linear siloxane absorption peak to the maximum cyclic siloxane absorption peak for each of the six polymers and also shows which polymers pass the salt fog test described in Method 509.5 5 in MIL-STD-810G (2008). This test comprises performing the following procedure. First, a polymer deposited on a substrate is placed in a chamber, the temperature is adjusted to 35° C., and the polymer and substrate are conditioned at this temperature for at least two hours. Then, a 5% solution of sodium chloride in water is continuously atomized into the test chamber for 24 hours. The salt fog fallout rate and the pH of the fallout solution are measured every 24 hours, and the fallout is kept between 1 and 3 mL/80 $cm^2$/hour. The polymer and substrate are then dried at standard ambient temperature and a relative humidity of less than 50% for 24 hours, after which the polymer and substrate are again exposed to the atomized salt solution for 24 hours and then dried for 24 hours once again. Then, the polymer and substrate are photographed, rinsed with running water under standard ambient conditions, and then examined for evidence of corrosion. The extent of salt deposits is noted, the substrate is tested for electrical malfunction, and any corrosion observed is assessed to determine its immediate and potential long-term effects on the functionality and structural integrity of the substrate.

As can be seen from FIGS. 17A-B and Table 1, polymers deposited at low values of total energy per monomer retained a higher percentage of cyclic siloxane groups and performed better during the salt fog test.

TABLE 1

| Sample Number | Plasma Power (W) | Volumetric Plasma Power Density ($mW/cm^3$) | Total Energy per Monomer (J/Molecule $\times 10^{-24}$) | Maximum Absorbance of Cyclic Siloxane Peak (AU) | Maximum Absorbance of Linear Siloxane Peak (AU) | Percent Cyclic Siloxane Groups in Polymer |
|---|---|---|---|---|---|---|
| 1 | 0 | 0.0 | 0.0 | 0.21296 | 0.04008 | 84% |
| 2 | 6 | 0.04 | 1.9 | 0.16482 | 0.08668 | 66% |
| 3 | 20 | 0.12 | 6.37 | 0.13067 | 0.07177 | 65% |
| 4 | 100 | 0.59 | 31.7 | 0.10272 | 0.06824 | 60% |
| 5 | 240 | 1.42 | 76.1 | 0.01596 | 0.01290 | 55% |
| 6 | 600 | 3.55 | 190.3 | 0.14134 | 0.14771 | 49% |

Example 2

This Example describes the environmental testing of polymers deposited at varying plasma powers.

Two polymers were deposited in deposition chambers as described in Example 1 and employing the reagents described in Example 1. The polymers were deposited to a thickness of 1 micron. The substrates employed were interdigitated electrodes (IDEs) with 10-micron line spacing purchased from MicruX Technologies, Asturias, Spain. A control sample that took the form of otherwise-equivalent uncoated interdigitated electrodes was also prepared and analyzed. A summary of the samples is provided below in Table 2.

TABLE 2

| Sample Number | Total Energy per Monomer (J/Molecule $\times 10^{-24}$) | Percent Cyclic Siloxane Groups in Polymer |
|---|---|---|
| Control | N/A | N/A |
| 1 | 31.7 | 60% |
| 2 | 177 | 51% |

Figure 18:
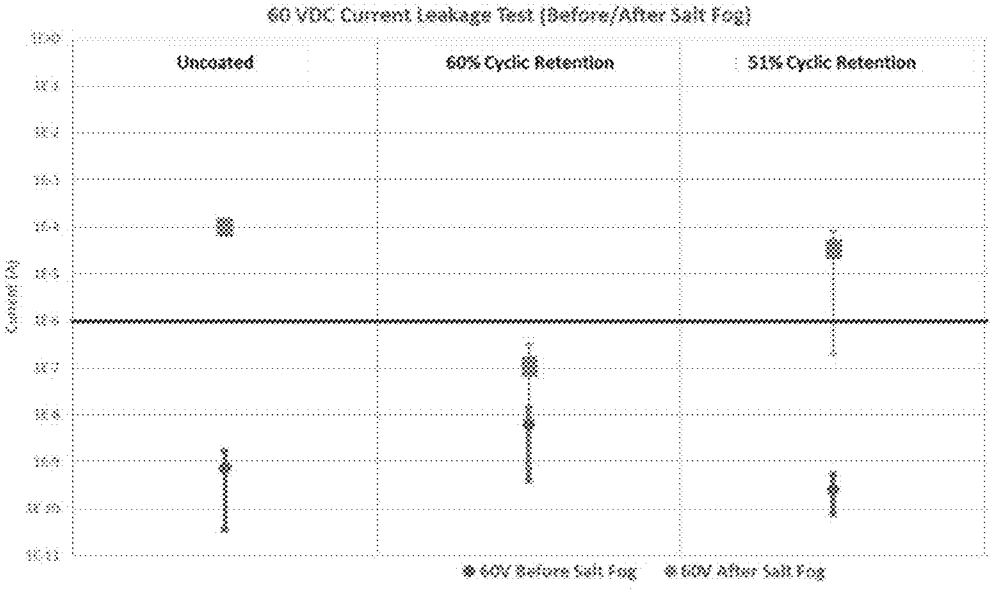
FIG. 18 shows the leakage currents for various samples before and after the salt fog test, in accordance with some embodiments.

Each sample was subjected to the salt fog test described in Example 1. Before and after, their electrical performance was assessed by evaluating the leakage current under a 60 V direct current bias. FIG. 18 shows the results of these tests. The horizontal line shown in FIG. 17 is at a leakage current of $10^{-6}$ A. Samples having leakage currents above this value after the salt fog test are considered to fail the salt fog test because they are indicative of the formation of conductive pathways between the interdigitated electrodes of the samples due to corrosion and/or moisture ingress. By contrast, samples having leakage currents below this value are considered to pass the salt fog test. As can be seen from FIG. 17, the substrate on which the polymer for which 60% of the cyclic siloxane groups were retained was the only sample that passed the salt fog test.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A plasma-enhanced chemical vapor deposition (PECVD) reactor, comprising:

a deposition chamber, wherein the deposition chamber is enclosed by a plurality of walls;

wherein the plurality of walls comprises a bottom wall and sidewalls surrounding the bottom wall;

wherein a plasma electrode is positioned inside the deposition chamber above the bottom wall, and wherein a ratio of a spacing between the plasma electrode and its closest sidewall to a spacing between the plasma electrode and the bottom wall is selected to allow flow of a precursor gas to be laminar or substantially laminar; and a control system, wherein:

the control system is configured to control one or more of a composition of the precursor gas, a flow rate of the precursor gas, a pressure inside the deposition chamber, and/or a power supplied by the plasma electrode, and the control system is configured to maintain a total energy to which a monomer flowing through the deposition chamber is exposed at a value that is greater than or equal to $1.5\times10^{-24}$ J/molecule and less than or equal to $32.0\times10^{-24}$ J/molecule.

2. The PECVD reactor of claim 1, wherein the ratio of the spacing between the plasma electrode and its closest sidewall to the spacing between the plasma electrode and the bottom wall is greater than or equal to 0.1 and less than or equal to 0.4, greater than or equal to 0.1 and less than or equal to 0.3, greater than or equal to 0.15 and less than or equal to 0.4, greater than or equal to 0.12 and less than or equal to 0.4, greater than or equal to 0.12 and less than or equal to 0.3, or greater than or equal to 0.12 and less than or equal to 0.2.

3. The PECVD reactor of claim 1, wherein the deposition chamber further comprises an inlet, wherein the inlet takes the form of a showerhead through which the precursor gas is introduced into the deposition chamber.

4. The PECVD reactor of claim 3, wherein the inlet is a ground electrode.

5. The PECVD reactor of claim 3, wherein the showerhead comprises a plurality of apertures through which the precursor gas is introduced into the deposition chamber, and wherein the apertures are positioned around an aperture-free region.

6. The PECVD reactor of claim 3, further comprising a premixing zone positioned upstream from the inlet, and wherein the premixing zone is configured such that two or more sources of gas are capable of mixing to form the precursor gas.

7. The PECVD reactor of claim 6, wherein a ratio of the volume of the premixing zone to a volume of the deposition chamber is greater than or equal to 0.06 and less than or equal to 0.15.

8. The PECVD reactor of claim 1, wherein the plasma electrode is configured to supply plasma at a power density of greater than or equal to 0.01 $mW/in^3$ and less than or equal to 0.6 $mW/in^3$.

9. The PECVD reactor of claim 1, wherein a spacing between the bottom wall and the plasma electrode is greater than or equal to 2 inches and less than or equal to 5 inches.

10. The PECVD reactor of claim 1, wherein the plasma electrode has a cross-sectional area that occupies greater than or equal to 80% of the cross-sectional area of the deposition chamber.

* * * * *